United States Patent
Fukunaga

(10) Patent No.: US 10,283,277 B2
(45) Date of Patent: May 7, 2019

(54) CAPACITOR AND SUBSTRATE MODULE

(71) Applicant: TDK CORPORATION, Tokyo (JP)

(72) Inventor: Tatsuya Fukunaga, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/906,454

(22) Filed: Feb. 27, 2018

(65) Prior Publication Data

US 2018/0277307 A1 Sep. 27, 2018

(30) Foreign Application Priority Data

Mar. 23, 2017 (JP) ................. 2017-056792
Nov. 15, 2017 (JP) ................. 2017-219866

(51) Int. Cl.
| | |
|---|---|
| *H05K 1/18* | (2006.01) |
| *H01G 4/38* | (2006.01) |
| *H01G 4/30* | (2006.01) |
| *H01G 4/228* | (2006.01) |
| *H01G 4/32* | (2006.01) |
| *H01G 4/005* | (2006.01) |

(52) U.S. Cl.
CPC ............. *H01G 4/38* (2013.01); *H01G 4/228* (2013.01); *H01G 4/30* (2013.01); *H05K 1/181* (2013.01); *H01G 4/005* (2013.01); *H01G 4/32* (2013.01); *H05K 2201/10015* (2013.01); *H05K 2201/10522* (2013.01)

(58) Field of Classification Search
CPC .. H05K 1/16; H05K 1/18; H01G 4/00; H01G 4/05; H01G 4/06; H01G 4/30; H01G 4/35; H01G 4/38; H01G 4/228

USPC ............. 174/260; 361/271, 302, 303, 306.1, 361/306.3; 257/700, 701, 758

See application file for complete search history.

(56) References Cited

U.S. PATENT DOCUMENTS

| | | | | |
|---|---|---|---|---|
| 7,310,217 B2* | 12/2007 | Takashima | ............... | H01G 4/30 361/306.1 |
| 7,428,135 B2* | 9/2008 | Togashi | ................ | H01G 4/012 361/303 |
| 7,567,425 B1* | 7/2009 | Lee | ........................ | H01G 4/012 361/306.1 |
| 7,595,973 B1 | 9/2009 | Lee et al. | | |

(Continued)

FOREIGN PATENT DOCUMENTS

| | | |
|---|---|---|
| JP | 2003-168620 A | 6/2003 |
| JP | 2009-060114 A | 3/2009 |
| JP | 2010-045323 A | 2/2010 |

*Primary Examiner* — Xiaoliang Chen
(74) *Attorney, Agent, or Firm* — Oliff PLC

(57) ABSTRACT

A substrate module includes capacitors, a first coupling conductor, and a mounting substrate. The first coupling conductor couples two of the capacitors together. The mounting substrate includes a first power supply layer and a second power supply layer. The capacitors each include a first electrode, a second electrode, a first terminal conductor, a second terminal conductor, and a third terminal conductor. The first terminal conductor is coupled to the first electrode and to the first power supply layer. The second terminal conductor is coupled to the second electrode and to the second power supply layer. The third terminal conductor is coupled to the first coupling conductor. The third terminal conductor is coupled to the first electrode at a coupling position that is different from a coupling position of the first terminal conductor.

10 Claims, 36 Drawing Sheets

(56) References Cited

U.S. PATENT DOCUMENTS

| | | | | |
|---|---|---|---|---|
| 7,630,208 B2* | 12/2009 | Lee | H01G 4/012 | 361/766 |
| 7,660,100 B2* | 2/2010 | Togashi | H01G 4/012 | 361/301.2 |
| 7,688,568 B1* | 3/2010 | Lee | H01G 4/232 | 361/303 |
| 7,881,040 B2* | 2/2011 | Togashi | H01G 4/232 | 361/302 |
| 8,050,012 B2* | 11/2011 | Lee | H01G 4/005 | 361/303 |
| 8,659,872 B2* | 2/2014 | Togashi | H01G 4/012 | 361/306.3 |
| 2002/0191368 A1* | 12/2002 | Li | H01G 4/38 | 361/306.1 |
| 2002/0195700 A1* | 12/2002 | Li | H01J 9/326 | 257/700 |
| 2006/0209492 A1* | 9/2006 | Togashi | H01G 4/232 | 361/303 |
| 2007/0067066 A1* | 3/2007 | Niki | H01L 23/645 | 700/286 |
| 2007/0279836 A1* | 12/2007 | Takashima | H01G 4/30 | 361/306.3 |
| 2008/0204969 A1* | 8/2008 | Takashima | H01G 4/232 | 361/301.4 |
| 2008/0259521 A1* | 10/2008 | Hockanson | H01G 4/228 | 361/271 |
| 2009/0141421 A1* | 6/2009 | Togashi | H01G 4/232 | 361/302 |
| 2009/0166071 A1* | 7/2009 | Hattori | H01G 4/35 | 174/260 |
| 2009/0213526 A1* | 8/2009 | Hsu | H01G 4/005 | 361/306.1 |
| 2009/0244807 A1* | 10/2009 | Lee | H01G 4/005 | 361/306.2 |
| 2010/0033897 A1* | 2/2010 | Lee | H01G 4/012 | 361/329 |

* cited by examiner

A-A'

CAPACITOR AND SUBSTRATE MODULE

CROSS REFERENCE TO RELATED APPLICATIONS

This application claims the benefit of Japanese Priority Patent Application JP2017-56792 filed on Mar. 23, 2017, and Japanese Priority Patent Application JP2017-219866 filed on Nov. 15, 2017, the entire contents of both of which are incorporated herein by reference.

BACKGROUND

The disclosure relates to a capacitor, and to a substrate module in which the capacitor is mounted on a substrate.

In order to reduce a noise that occurs in a power supply, it may be necessary to couple together capacitors having different capacities and different self-resonant frequencies between a direct current (DC) power supply layer and a ground layer, and to keep impedance low at a wideband frequency.

In a case of using the capacitors having different self-resonant frequencies, however, an antiresonance phenomenon occurs among the capacitors, thus causing a phenomenon in which impedance of the power supply layer is increased. As a means to suppress the phenomena, it has been proposed to use a capacitor having large equivalent series resistance (ESR). For example, reference is made to Japanese Unexamined Patent Application Publications No. 2003-168620, No. 2009-60114, and No. 2010-45323.

SUMMARY

It is desirable to provide a capacitor and a substrate module that make it possible to reduce antiresonance without increasing equivalent series resistance.

A substrate module according to an example embodiment of the disclosure includes: capacitors; a first coupling conductor that couples two of the capacitors together; and a mounting substrate that includes a first power supply layer and a second power supply layer, the capacitors each including a first electrode, a second electrode, a first terminal conductor coupled to the first electrode and to the first power supply layer, a second terminal conductor coupled to the second electrode and to the second power supply layer, and a third terminal conductor coupled to the first coupling conductor, the third terminal conductor being coupled to the first electrode at a coupling position that is different from a coupling position of the first terminal conductor.

A capacitor according to an example embodiment of the disclosure includes: a first electrode; a second electrode; a first terminal conductor coupled to the first electrode, the first terminal conductor being further coupled to a first power supply layer upon mounting on a mounting substrate, the mounting substrate including the first power supply layer and a second power supply layer; a second terminal conductor coupled to the second electrode, the second terminal conductor being further coupled to the second power supply layer upon mounting on the mounting substrate; and a third terminal conductor coupled to the first electrode at a coupling position that is different from a coupling position of the first terminal conductor, the third terminal conductor being further coupled to one of terminal conductors included in any other capacitor via a first coupling conductor, upon mounting on the mounting substrate together with the any other capacitor that includes the terminal conductors.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the disclosure.

DETAILED DESCRIPTION

Figure 1:
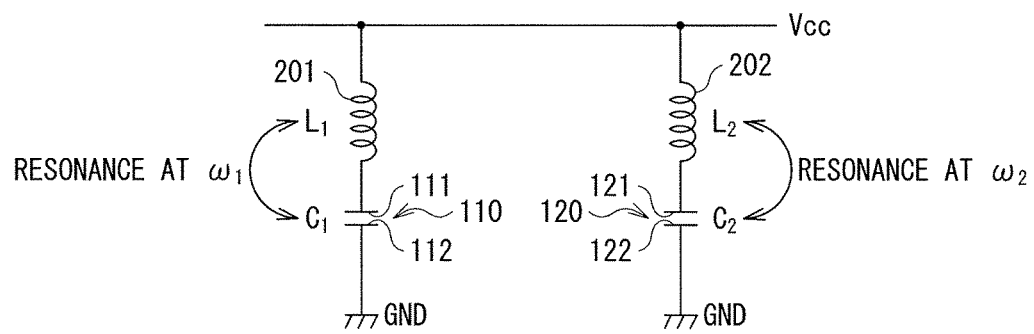
FIG. 1 is a circuit diagram illustrating an example of an equivalent circuit of two capacitors disposed in parallel.

Some embodiments of the disclosure are described below in detail with reference to the accompanying drawings.

It is to be noted that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. It is to be noted that the like elements are denoted with the same reference numerals, and any redundant description thereof will not be described in detail. It is to be noted that the description is given in the following order.

1. First Example Embodiment (FIGS. 1 to 26)
   1.1 Characteristics of Two Capacitors Disposed in Parallel
   1.2 Overview of Coupling of Capacitors according to First Example Embodiment
   1.3 Example of Capacitor and Substrate Module according to First Example Embodiment
      1.3.1 First Example (FIGS. 9 to 21)
      1.3.2 Second Example (FIGS. 22 to 26)
2. Second Example Embodiment (FIGS. 27 to 43)
3. Third Example Embodiment (FIGS. 44 to 60)
4. Fourth Example Embodiments (FIG. 61)
5. Fifth Example Embodiment (FIGS. 62 to 64)
6. Other Example Embodiments 1. First Example Embodiment

[1.1 Characteristics of Two Capacitors Disposed in Parallel]

FIG. 1 illustrates an example of an equivalent circuit of two capacitors 110 and 120 disposed in parallel.

The capacitor 110 includes a first electrode 111 and a second electrode 112. The capacitor 120 includes a first electrode 121 and a second electrode 122.

The first electrode 111 of the capacitor 110 may be coupled to a DC power supply layer Vcc. The second electrode 112 of the capacitor 110 may be coupled to a ground layer GND. An inductor 201 such as an equivalent series inductance (ESL) may be present on a line including the capacitor 110 between the DC power supply layer Vcc and the ground layer GND. It is to be noted that FIG. 1 illustrates the inductor 201 being present between the first electrode 111 and the DC power supply layer Vcc.

Likewise, the first electrode 121 of the capacitor 120 may be coupled to the DC power supply layer Vcc. The second electrode 122 of the capacitor 120 may be coupled to the ground layer GND. An inductor 202 such as the equivalent series inductance may be present on a line including the capacitor 120 between the DC power supply layer Vcc and the ground layer GND. It is to be noted that FIG. 1 illustrates an example in which the inductor 202 is present between the first electrode 121 and the DC power supply layer Vcc.

The capacitor 110 may undergo self-resonance at an angular frequency $\omega_1$ owing to the presence of the inductor 201. Likewise, the capacitor 120 may undergo self-resonance at an angular frequency $\omega_2$ owing to the presence of the inductor 202.

Parallel disposing of capacitors having different self-resonant frequencies allows for reduction in a noise at a wide band. On the other hand, in a case of the disposing of the capacitors, parallel resonance (i.e., antiresonance) occurs. An angular frequency $\omega_0$ of the antiresonance may be calculated as described below.

A resonator configured by the capacitor 110 with a capacity $C_1$ and the inductor 201 with an inductance $L_1$ is defined as a first series resonator. A resonator configured by the capacitor 120 with a capacity $C_2$ and the inductor 202 with an inductance $L_2$ is defined as a second series resonator. In this case, as for the first series resonator and the second series resonator, the following expression holds:

$$\begin{cases} L_1 C_1 = \dfrac{1}{\omega_1^2} \\ L_2 C_2 = \dfrac{1}{\omega_2^2} \end{cases} \quad (1)$$

An input impedance $Z_1$ of the first series resonator is determined by the following expression:

$$Z_1 = j\left(\omega L_1 - \frac{1}{\omega C_1}\right)$$
$$= \frac{j}{\omega C_1}\left\{\left(\frac{\omega}{\omega_1}\right)^2 - 1\right\} \because (1)$$

An input admittance $Y_1$ of the first series resonator is determined by the following expression:

$$Y_1 = \frac{j\omega C_1}{1 - \left(\frac{\omega}{\omega_1}\right)^2}$$

An input admittance $Y_2$ of the second series resonator is determined by the following expression:

$$Y_2 = \frac{j\omega C_2}{1 - \left(\frac{\omega}{\omega_2}\right)^2}$$

When the first series resonator and the second series resonator undergo parallel resonance at the angular frequency $\omega_0$, the following expression holds:

$$(Y_1 + Y_2)|_{\omega=\omega_0} = 0 \Leftrightarrow j\omega_0\left\{\frac{C_1}{1-\left(\frac{\omega_0}{\omega_1}\right)^2} + \frac{C_2}{1-\left(\frac{\omega_0}{\omega_2}\right)^2}\right\} = 0$$

From the above expression, the angular frequency $\omega_0$ of the antiresonance is determined by the following expression:

$$\omega_0 = \sqrt{\frac{C_1 + C_2}{\frac{C_1}{\omega_2^2} + \frac{C_2}{\omega_1^2}}}$$

It can be appreciated, from the above expression, that the angular frequency $\omega_0$ of the antiresonance corresponds to an intermediate value between the angular frequency $\omega_1$ of the first series resonator and the angular frequency $\omega_2$ of the second series resonator.

Figure 2:
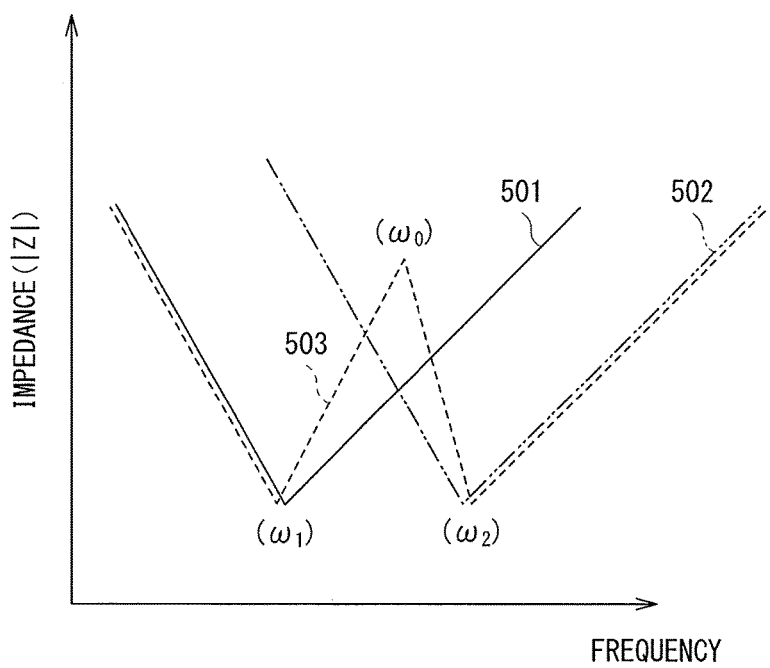
FIG. 2 describes an overview of impedance characteristics of the equivalent circuit illustrated in FIG. 1.
Figure 3:
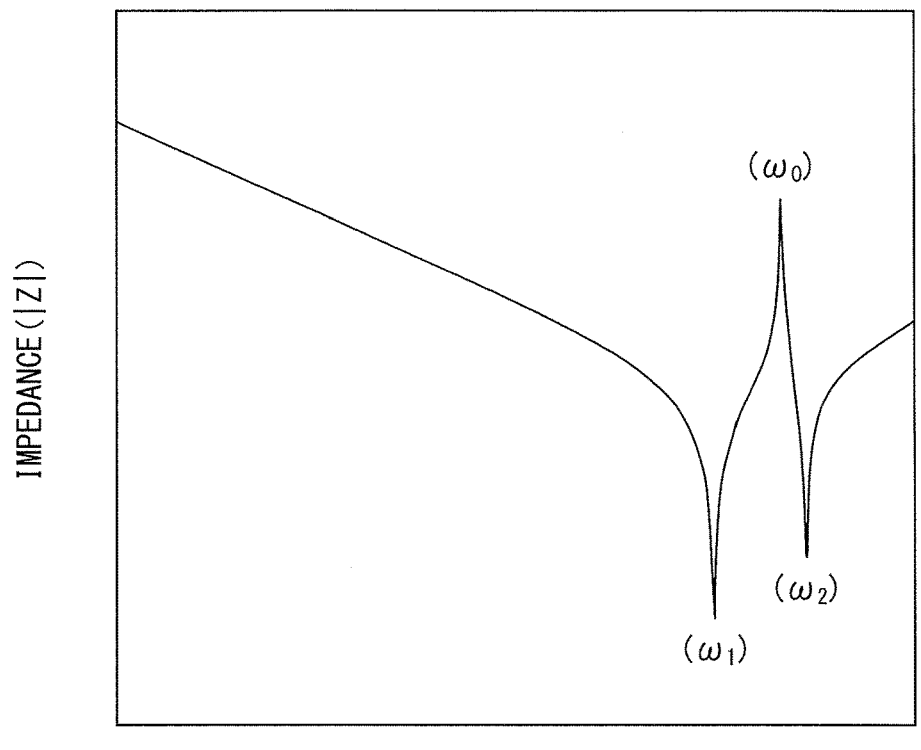
FIG. 3 is a characteristic diagram illustrating an example of the impedance characteristics of the equivalent circuit illustrated in FIG. 1.

FIG. 2 illustrates an overview of impedance characteristics between the ground layer GND and the DC power supply layer Vcc of the equivalent circuit illustrated in FIG. 1. FIG. 3 illustrates an example of the impedance characteristics between the ground layer GND and the DC power supply layer Vcc of the equivalent circuit illustrated in FIG. 1. In FIG. 2, a reference numeral 501 denotes characteristics in a case where the capacitor 110 is disposed singly between the ground layer GND and the DC power supply layer Vcc. A reference numeral 502 denotes characteristics in a case where the capacitor 120 is disposed singly between the ground layer GND and the DC power supply layer Vcc. A reference numeral 503 denotes characteristics in a case where the two capacitors 110 and 120 are disposed parallel between the ground layer GND and the DC power supply layer Vcc.

As can be appreciated from FIGS. 2 and 3, there is an issue where the parallel disposing of the two capacitors 110 and 120 causes an increased impedance due to the antiresonance, thus resulting in an increased noise.

Figure 4:
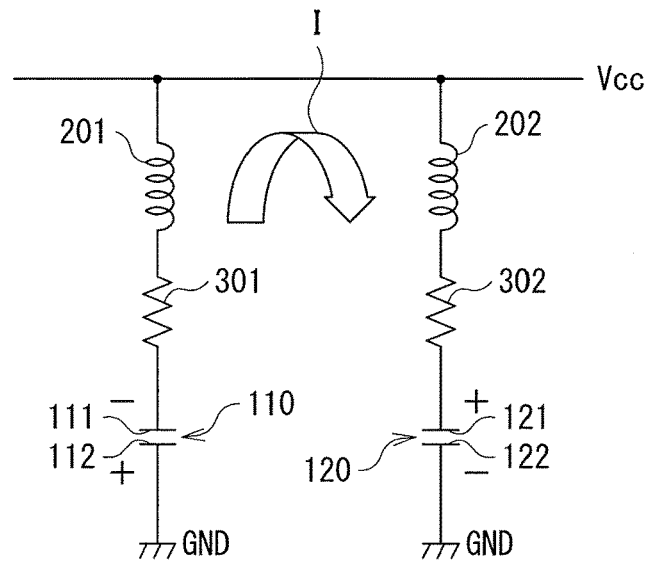
FIG. 4 is a circuit diagram illustrating an example of a circuit according to a comparative example using two capacitors disposed in parallel.

FIG. 4 illustrates an example of a circuit according to a comparative example using two capacitors disposed in parallel.

In order to suppress the increased impedance due to the antiresonance described above, the comparative example of FIG. 4 exemplifies intentional generation of equivalent series resistances 301 and 302 against the two capacitors 110 and 120, respectively. FIG. 4 illustrates an example in which the equivalent series resistance 301 and the inductor 201 are present between the first electrode 111 of the capacitor 110 and the DC power supply layer Vcc. FIG. 4 further illustrates an example in which the equivalent series resistance 302 and the inductor 202 are present between the first electrode 121 of the capacitor 120 and the DC power supply layer Vcc.

A resistance R of a conductor is determined by the following expression.

$R = l \cdot \rho / S$ where $\rho$ denotes resistivity (i.e., a material-specific value),
S denotes cross-sectional area of the conductor, and
l denotes a length of the conductor.

Non-limiting examples of a method for increasing the equivalent series resistance may include increasing a path in which a current flows and decreasing cross-sectional area of an electrode, because of difficulty in varying the resistance value that is a material-specific value.

However, increasing a length of the path in which the current flows to increase the equivalent series resistances 301 and 302 may result in an increased equivalent series inductance, thus leading to possible deterioration in high-frequency characteristics of the capacitor. Further, due to the increased equivalent series resistances, a current I that flows upon antiresonance as illustrated in FIG. 4 and a noise (i.e., a noise current) that occurs may be changed into heat in increased amounts, thus leading to possible deterioration in a power supply efficiency. It is to be noted that the current I that flows upon the antiresonance is an alternating current and that an orientation of the flowing current I may be may be possibly opposite to the orientation illustrated in FIG. 4. FIG. 4 exemplifies a case where the current I flows at a moment when the first electrode 111 of the capacitor 110 is turned into minus (−) and the second electrode 112 of the capacitor 110 is turned into plus (+) and when the first electrode 121 of the capacitor 120 is turned into plus (+) and the second electrode 122 of the capacitor 120 is turned into minus (−).

For the circuit according to the comparative example of FIG. 4, it is desired to develop a technique that makes it possible to suppress an increase in the equivalent series resistance or equivalent series inductance of the capacitor and thus to suppress the antiresonance.

[1.2 Overview of Coupling of Capacitors According to First Example Embodiment]

Figure 5:
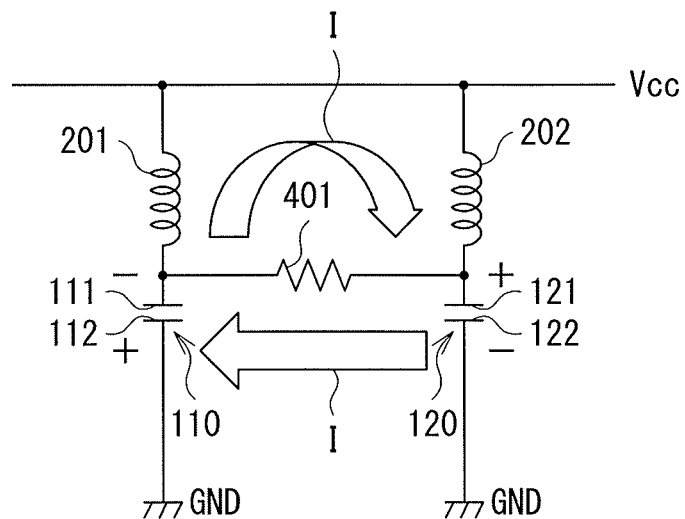
FIG. 5 is an equivalent circuit diagram illustrating an overview of a coupling of two capacitors according to a first example embodiment.
Figure 6:
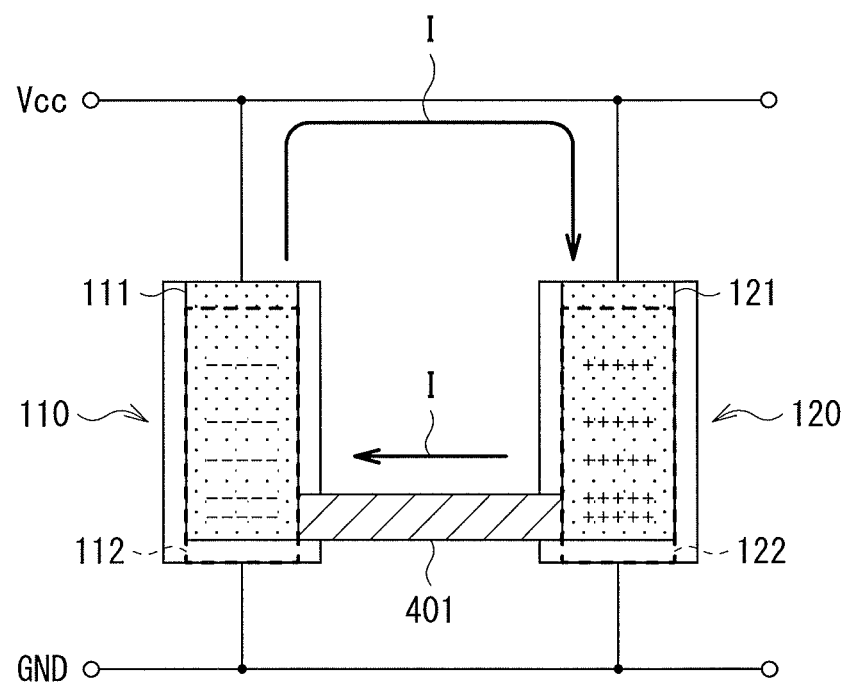
FIG. 6 is a configuration diagram illustrating an example of a configuration that allows for achievement of the coupling illustrated in FIG. 5.

FIG. 5 illustrates an overview of a coupling of the two capacitors 110 and 120 according to a first example embodiment of the disclosure, using an equivalent circuit. FIG. 6 illustrates an example of a configuration that allows for achievement of the coupling illustrated in FIG. 5.

As illustrated in FIGS. 5 and 6, the two capacitors 110 and 120 are coupled together via a coupling conductor 401 having a resistance. For example, as illustrated in FIG. 6, the first electrode 111 of the capacitor 110 and the first electrode 121 of the capacitor 120 may be coupled together. This generates a potential difference between the first electrode 111 of the capacitor 110 and the first electrode 121 of the capacitor 120, upon the antiresonance, at positions where the coupling conductor 401 is coupled, thus causing the current I to flow via the coupling conductor 401. This allows energy of the antiresonance to be absorbed as Joule heat via the coupling conductor 401 and thus to be attenuated. This makes it possible to attenuate the antiresonance without substantially varying the equivalent series resistance or equivalent series inductance which the capacitors 110 and 120 originally have.

Figure 7:
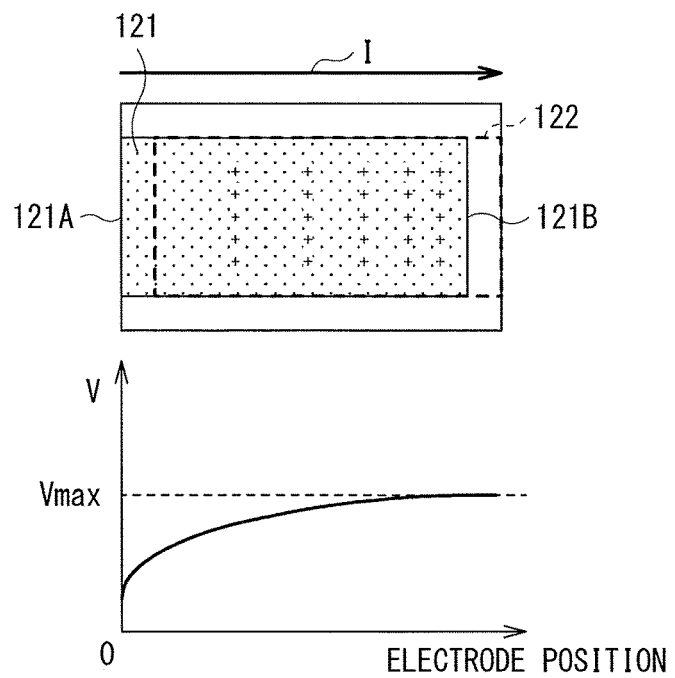
FIG. 7 describes a relationship between a position of an electrode of a capacitor illustrated in FIG. 6 and a potential at the position of the electrode.

FIG. 7 illustrates a relationship between a position of the electrode of the capacitor illustrated in FIG. 6 and a potential at the position of the electrode.

For example, as illustrated in FIG. 7, side of an open end 121B of the electrode 121 of the capacitor 120 may have a larger potential difference relative to a power supply-coupling end 121A thereof than a potential difference of side of the power supply-coupling end 121A.

It is to be noted that the open end as used herein refers to an electrically open end of longitudinal ends of an electrode, i.e., the first electrode 121 or the second electrode 122 of the capacitor 120. In this case, there is no current that flows across the electrode end which is the open end. Further, the power supply-coupling end as used herein refers to an end coupled to the power supply layer, of the longitudinal ends of an electrode, i.e., the first electrode 121 or the second electrode 122 of the capacitor 120. The power supply layer as used herein may encompass a case where the power supply layer indicates not only the DC power supply layer Vcc, but also the ground layer GND.

Accordingly, in one embodiment, the positions at which the above-described coupling conductor 410 is to be coupled may be positions close to the respective open end sides of the first electrode 111 of the capacitor 110 and the first electrode 121 of the capacitor 120. This enables the potential difference between the two capacitors 110 and 120 to be larger at the positions where the coupling conductor 401 is coupled, thus making it possible to effectively achieve an effect of cancelling the antiresonance.

A power consumption P of the conductor at a constant voltage is expressed by $P=V^2/R$, where a potential difference is denoted by V, and a resistance value is denoted by R. The power consumption P is proportional to the square of the potential difference. Accordingly, the larger the potential difference V becomes, the larger the power consumption P becomes, thus converting the energy of the antiresonance into heat. Further, the smaller the resistance value of the coupling conductor 401 becomes, the larger the power consumption P becomes, thus converting the energy of the antiresonance into heat.

Figure 8:
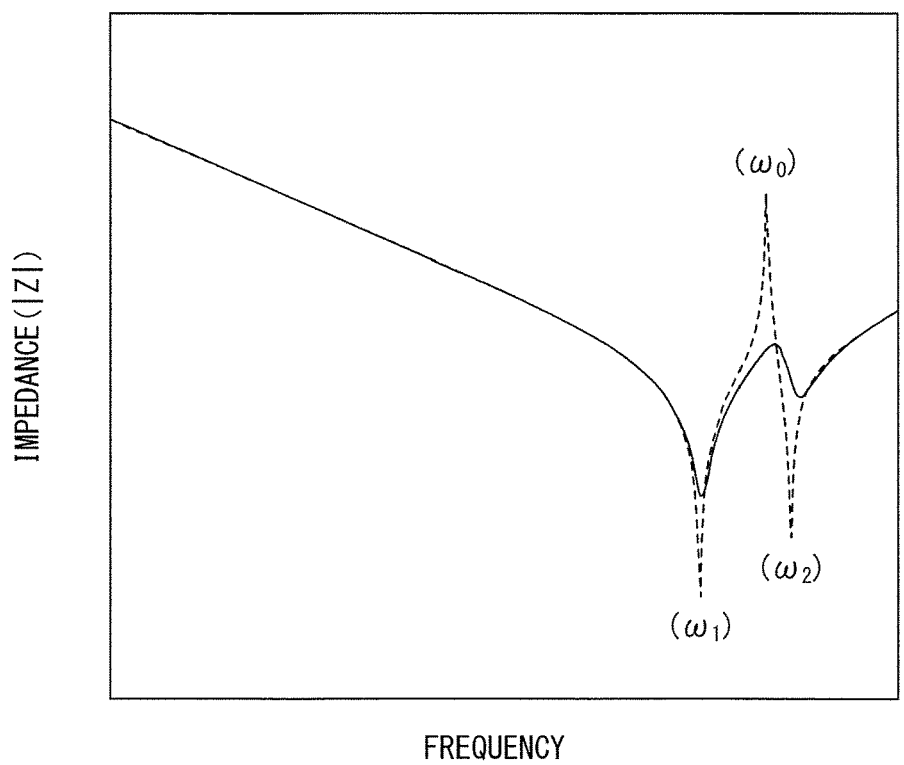
FIG. 8 is a characteristic diagram illustrating an example of impedance characteristics in a case where two capacitors are coupled together in accordance with the coupling illustrated in FIG. 5.

FIG. 8 illustrates an example of impedance characteristics (indicated by a solid line) in a case where two capacitors 110 and 120 are coupled together in accordance with the coupling illustrated in FIG. 5. It is to be noted that a broken line in FIG. 8 indicates characteristics in a case where no coupling is made by the coupling conductor 401.

As illustrated in FIG. 8, the coupling of the two capacitors 110 and 120 in accordance with the coupling illustrated in FIG. 5 allows for suppression of the increased impedance due to the antiresonance.

[1.3 Example of Capacitor and Substrate Module According to First Example Embodiment]

Description is given next of an example of each of a capacitor and a substrate module that allow for achievement of the coupling described in the above-mentioned FIGS. 5 to 7.

The substrate module in an embodiment of the disclosure includes the capacitor, and a mounting substrate that includes a first power supply layer and a second power supply layer. One of the first power supply layer and the second power supply layer according to an embodiment of the disclosure may be the ground layer GND. The other of the first power supply layer and the second power supply layer may be the DC power supply layer Vcc. Further, two DC power supply layers having different voltages may be included instead of the combination of the ground layer GND and the DC power supply layer Vcc. In this case, one of the first power supply layer and the second power supply layer according to an embodiment of the disclosure may be a first DC power supply layer that supplies a first DC voltage. The other of the first power supply layer and the second power supply layer may be a second DC power supply layer that supplies a second DC voltage.

In the following first example embodiment, description is given by exemplifying a case where the mounting substrate includes, as the power supply layer, the ground layer GND and the DC power supply layer Vcc, although the power supply layer according to an embodiment of the disclosure is not limited to the ground layer GND and the DC power supply layer Vcc as described above. The description is given by exemplifying a case where the first power supply layer corresponds to the DC power supply layer Vcc and the second power supply layer corresponds to the ground layer GND. The same holds true also for other example embodiments described hereinafter.

1.3.1 First Example

Figure 9:
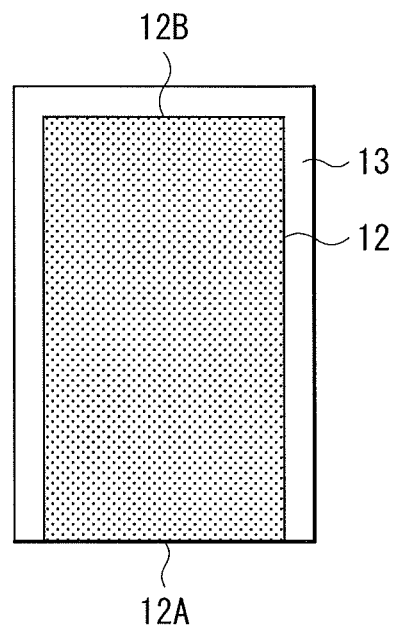
FIG. 9 is a plan view of a configuration example of a second electrode in a capacitor according to a first example of the first example embodiment.
Figure 10:
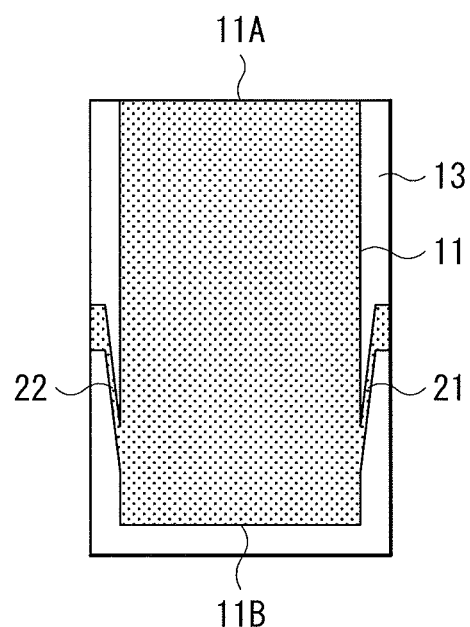
FIG. 10 is a plan view of a configuration example of a first electrode in the capacitor according to the first example of the first example embodiment.
Figure 11:
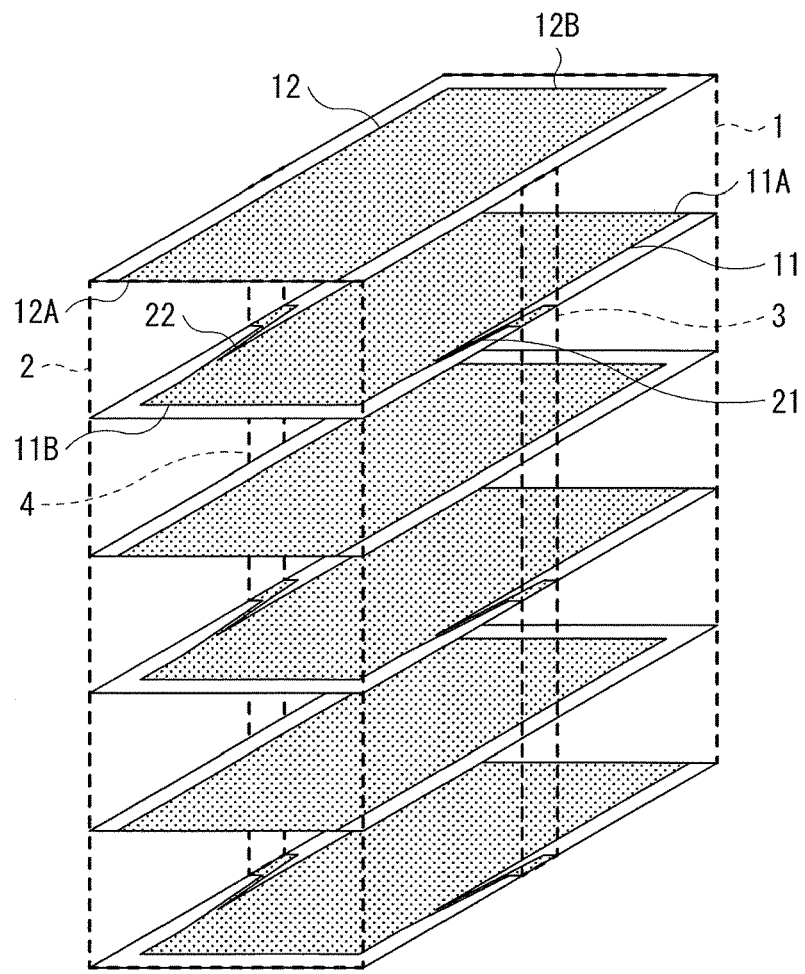
FIG. 11 is an exploded perspective view of an example of an overall configuration of the capacitor according to the first example of the first example embodiment.
Figure 12:
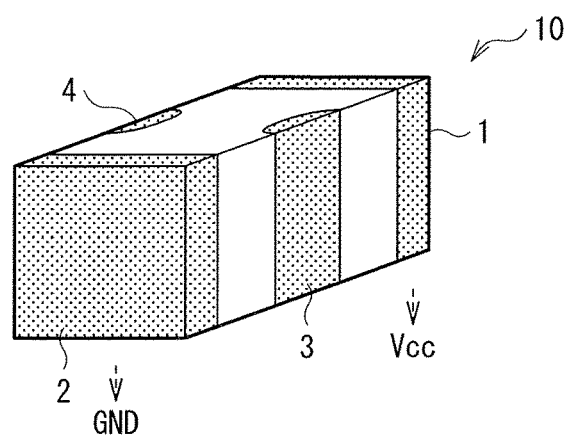
FIG. 12 is a perspective view of an example of an appearance of the capacitor according to the first example of the first example embodiment.

FIG. 9 illustrates a configuration example of a second electrode 12 in a capacitor 10 according to a first example of the first example embodiment. FIG. 10 illustrates a configuration example of a first electrode 11 in the capacitor 10 according to the first example. FIG. 11 illustrates an example of an overall configuration of the capacitor 10 according to the first example. FIG. 12 illustrates an example of an appearance of the capacitor 10 according to the first example.

The capacitor 10 according to the first example may include the first electrode 11, the second electrode 12, a first terminal conductor 1, a second terminal conductor 2, a third terminal conductor 3, and a fourth terminal conductor 4.

As illustrated in FIG. 10, the first electrode 11 may include a power supply-coupling end 11A and an open end 11B. Further, the first electrode 11 may include a led-out part 21 that couples the first electrode 11 to the third terminal conductor 3, and a led-out part 22 that couples the first electrode 11 to the fourth terminal conductor 4. The first electrode 11 may be formed on a surface of a dielectric 13.

As illustrated in FIG. 9, the second electrode 12 may include a power supply-coupling end 12A and an open end 12B. The second electrode 12 may be formed on a surface of the dielectric 13.

As illustrated in FIG. 11, the capacitor 10 may be a laminated capacitor in which first electrodes 11 and second electrodes 12 are disposed alternately in a laminated manner, with the dielectric being interposed therebetween. FIG. 11 exemplifies a case where an uppermost electrode is the second electrode 12; however, the uppermost electrode may be the first electrode 11. The dielectric 13 may be further formed on the uppermost electrode, i.e., on the first electrode 11 or the second electrode 12, although illustration thereof is omitted in FIG. 11.

As illustrated in FIG. 12, the capacitor 10 as a whole may have a substantially cuboid shape.

As illustrated in FIG. 12, the first terminal conductor 1 may be formed at least on a first surface of the substantially cuboid shape. Further, the first terminal conductor 1 may be formed to extend to at least another surface that is in contact with the first surface of the substantially cuboid shape.

As illustrated in FIG. 12, the second terminal conductor 2 may be formed at least on a second surface of the substantially cuboid shape. The second surface may face the first surface. Further, the second terminal conductor 2 may be formed to extend to at least another surface that is in contact with the second surface of the substantially cuboid shape.

As illustrated in FIG. 12, the third terminal conductor 3 may be formed at least on a third surface of the substantially cuboid shape. Further, the third terminal conductor 3 may be formed to extend to at least another surface that is in contact with the third surface of the substantially cuboid shape.

As illustrated in FIG. 12, the fourth terminal conductor 4 may be formed at least on a fourth surface of the substantially cuboid shape. The fourth surface may face the third surface. Further, the fourth terminal conductor 4 may be formed to extend to at least another surface that is in contact with the fourth surface of the substantially cuboid shape.

The first terminal conductor 1 may be coupled to the power supply-coupling end 11A of the first electrode 11. The first electrode 11 may be coupled to the DC power supply layer Vcc via the first terminal conductor 1.

The second terminal conductor 2 may be coupled to the power supply-coupling end 12A of the second electrode 12. The second electrode 12 may be coupled to the ground layer GND via the second terminal conductor 2.

The third terminal conductor 3 is coupled to the first electrode 11 at a coupling position different from that of the first terminal conductor 1. As illustrated in a coupling described later (e.g., in FIG. 16), the third terminal conductor 3 may be coupled to a first coupling conductor 41 formed on the mounting substrate, for example. This allows two capacitors 10 (e.g., adjacent capacitors 10-1 and 10-2) to be coupled together via the first coupling conductor 41, as illustrated in the coupling described later (e.g., in FIG. 16).

Figure 14:
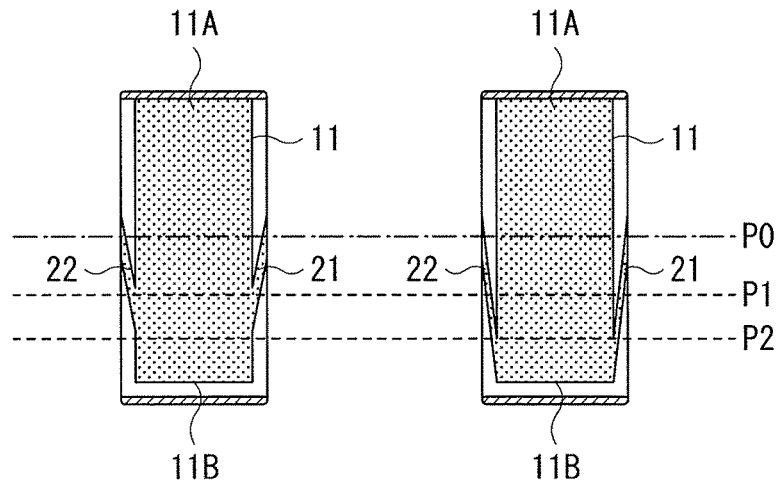
FIG. 14 describes a coupling position, in one embodiment, of each of a third terminal conductor and a fourth terminal conductor to the first electrode in the capacitor according to the first example of the first example embodiment.

As illustrated in FIG. 14 described later, in one embodiment, the third terminal conductor 3 may be coupled to the first electrode 11 at a position closer to the open end 11B of the first electrode 11 than an intermediate position P0 between a coupling position (i.e., the power supply-coupling end 11A) of the first terminal conductor 1 in the first electrode 11 and the open end 11B.

The fourth terminal conductor 4 may be coupled to the first electrode 11 at a coupling position different from those of the first terminal conductor 1 and the third terminal conductor 3. As illustrated in the coupling described later (e.g., in FIG. 16), the fourth terminal conductor 4 may be coupled to the first coupling conductor 41 formed on the mounting substrate, for example. This allows the two capacitors 10 (e.g., the adjacent capacitors 10-1 and 10-2) to be coupled together via the first coupling conductor 41, as illustrated in the coupling described later (e.g., in FIG. 16).

As illustrated in FIG. 14 described later, in one embodiment, the fourth terminal conductor 4 may be coupled to the first electrode 11 at a position closer to the open end 11B of the first electrode 11 than the intermediate position P0 between the coupling position (i.e., the power supply-coupling end 11A) of the first terminal conductor 1 in the first electrode 11 and the open end 11B.

Figure 13:
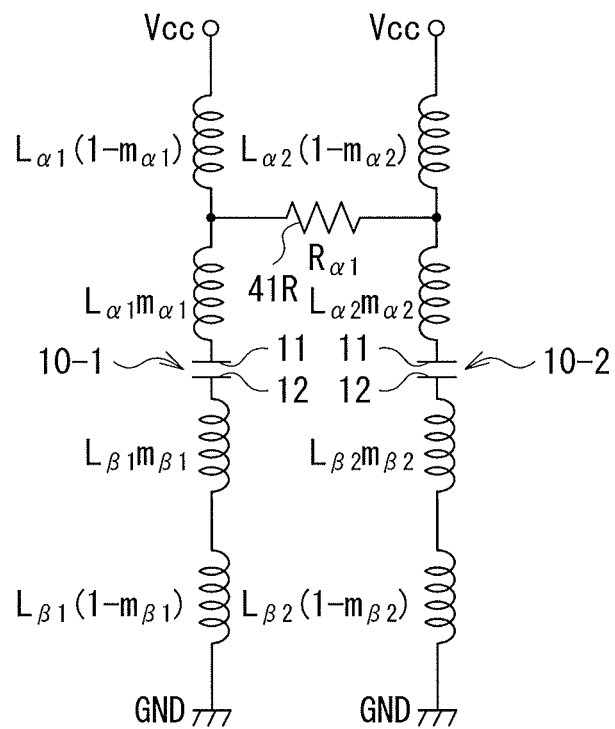
FIG. 13 is a circuit diagram illustrating an example of an equivalent circuit in a case where two capacitors according to the first example of the first example embodiment are disposed in parallel.

FIG. 13 illustrates an example of an equivalent circuit in a case where the two capacitors 10 (the capacitors 10-1 and 10-2) according to the first example are disposed in parallel.

The capacitors 10-1 and 10-2 may be coupled together via a resistance 41R that occurs due to, for example, the first coupling conductor 41 in accordance with the coupling described later (e.g., in FIG. 16). A resistance value of the resistance 41R is denoted by $R\alpha_1$.

An inductance that occurs between the first electrode 11 of the capacitor 10-1 and the DC power supply layer Vcc is denoted by $L\alpha_1$. The inductance $L\alpha_1$ may be divided into two inductances with respective rates of $m\alpha_1$ and $(1-m\alpha_1)$. An inductance that occurs between the second electrode 12 of the capacitor 10-1 and the ground layer GND is denoted by $L\beta_1$. The inductance $L\beta_1$ may be divided into two inductances with respective rates of $m\beta_1$ and $(1-m\beta_1)$.

An inductance that occurs between the first electrode 11 of the capacitor 10-2 and the DC power supply layer Vcc is denoted by $L\alpha_2$. The inductance $L\alpha_2$ may be divided into two inductances with respective rates of $m\alpha_2$ and $(1-m\alpha_2)$. An inductance that occurs between the second electrode 12 of the capacitor 10-2 and the ground layer GND is denoted by $L\beta_2$. The inductance $L\beta_2$ may be divided into two inductances with respective rates of $m\beta_2$ and $(1-m\beta_2)$.

In the capacitor 10-1, an inductance that occurs between a coupling position of the resistance 41R in the first electrode 11 and the open end 11B of the first electrode 11 is denoted by $L\alpha_1 m\alpha_1$. Further, in the capacitor 10-2, an inductance that occurs between a coupling position of the resistance 41R in the first electrode 11 and the open end 11B of the first electrode 11 is denoted by $L\alpha_2 m\alpha_2$. The closer a value $m\alpha_i$ (here, $m\alpha_1$ and $m\alpha_2$) is to 0, the smaller an antiresonance value Q becomes.

In the above-described capacitor 10 of the first example, coupling positions of the third terminal conductor 3 and the fourth terminal conductor 4 to the first electrode 11 are those as illustrated in FIG. 14, in one embodiment. The coupling positions of the third terminal conductor 3 and the fourth terminal conductor 4 to the first electrode 11 may be each a position closer to the open end 11B of the first electrode 11 than the intermediate position P0 between the coupling position (i.e., the power supply-coupling end 11A) of the first terminal conductor 1 in the first electrode 11 and the open end 11B, in one embodiment. Further, a coupling position P2 in the right example of FIG. 14 may be closer to the open end 11B than a coupling position P1 in the left example of FIG. 14, in one embodiment. The coupling position P2 may have a smaller value than the coupling position P1 in the above-described $m\alpha_i$, thus further lowering the antiresonance value Q. This makes it possible to suppress occurrence of the antiresonance. In addition, as described with reference to the above-mentioned FIGS. 6 and 7, when the coupling positions of the third terminal conductor 3 and the fourth terminal conductor 4 to the first electrode 11 become closer to the open end 11B, it becomes possible to achieve the effect of cancelling the antiresonance more effectively.

[Example of Coupling]

Figure 15:
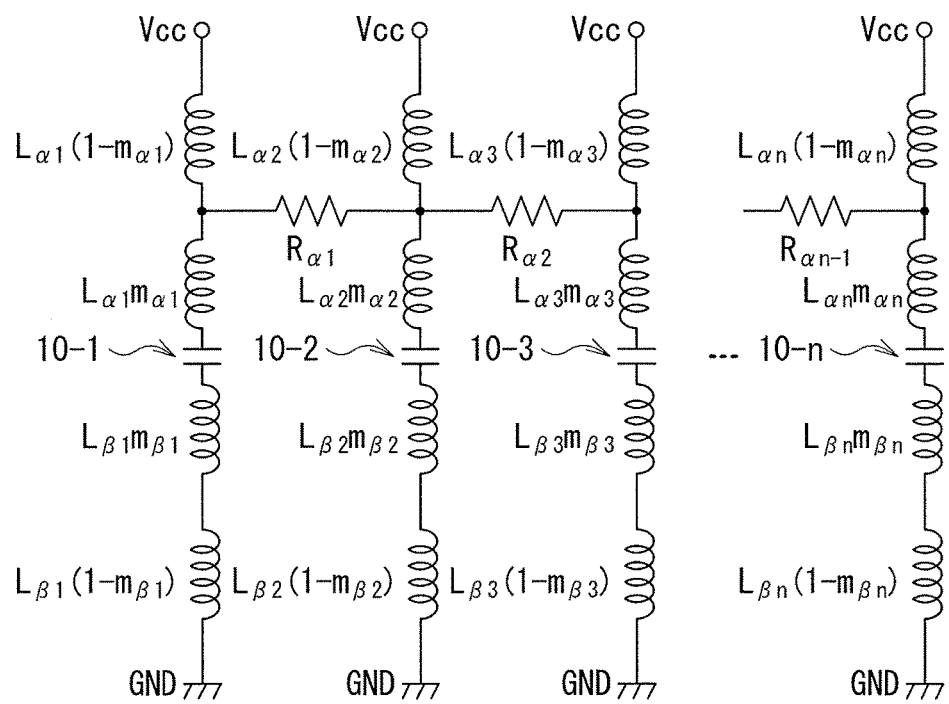
FIG. 15 is a circuit diagram illustrating an example of an equivalent circuit in a case where three or more capacitors according to the first example of the first example embodiment are disposed in parallel.

FIG. 15 illustrates an example of an equivalent circuit in a case where three or more capacitors 10 according to the first example of the first example embodiment are disposed in parallel. Description is given below of a coupling that achieves the equivalent circuit of FIG. 15. In addition, description is given of an example of the substrate module according to the first example embodiment.

[First Coupling of First Example]

Figure 16:
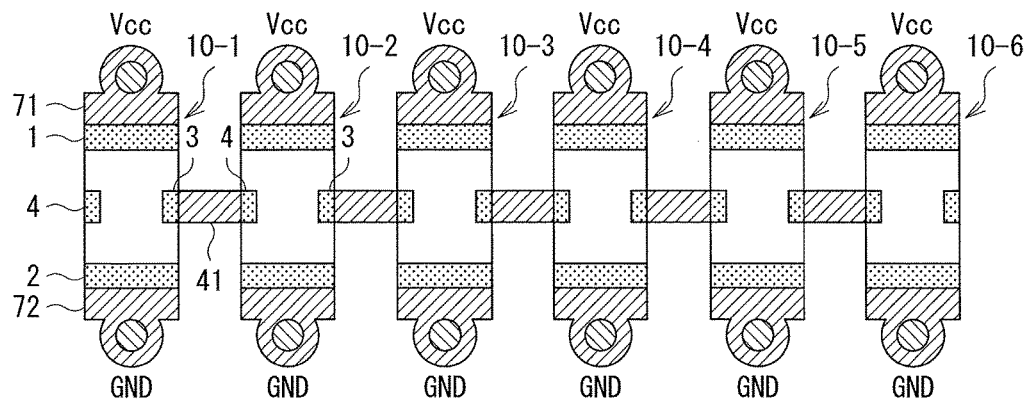
FIG. 16 is a configuration diagram illustrating an example of first coupling in the case where the three or more capacitors according to the first example of the first example embodiment are disposed in parallel.
Figure 17:
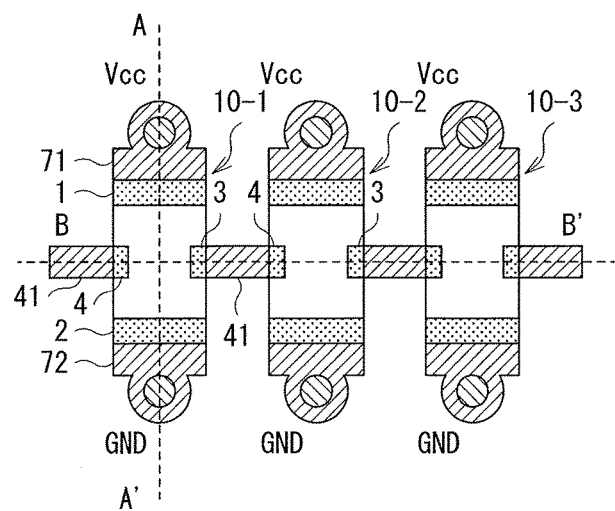
FIG. 17 is a configuration diagram illustrating a part of the configuration example illustrated in FIG. 16.
Figure 18:
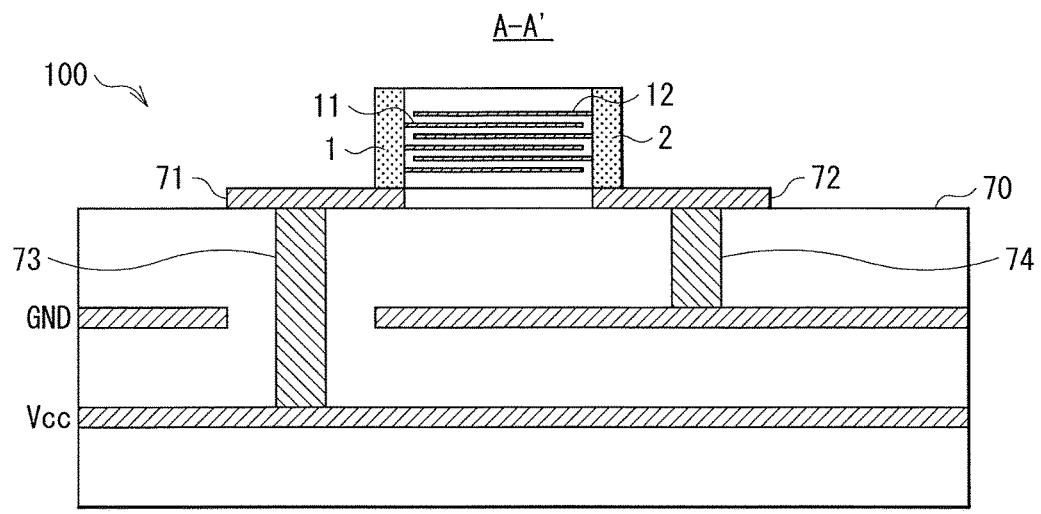
FIG. 18 is a cross-sectional view of an example of a cross-sectional configuration taken along a line A-A' in FIG. 17.
Figure 19:
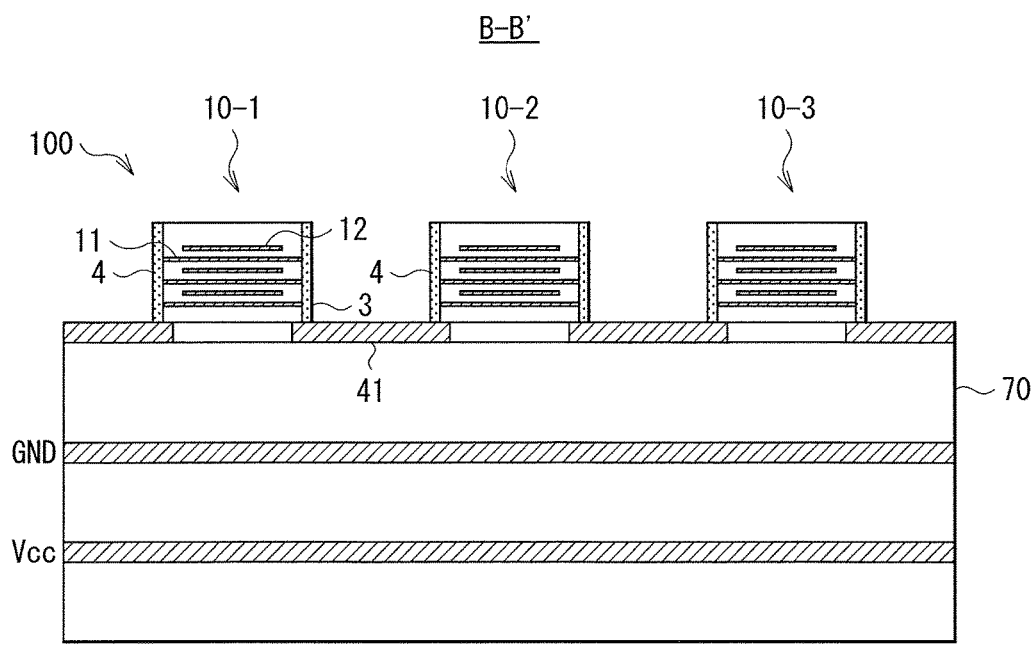
FIG. 19 is a cross-sectional view of an example of a cross-sectional configuration taken along a line B-B' in FIG. 17.

FIG. 16 illustrates an example of first coupling in the case where three or more capacitors 10 according to the first example are disposed in parallel. FIG. 17 illustrates a part of the configuration example illustrated in FIG. 16. FIG. 18 illustrates an example of a cross-sectional configuration taken along a line A-A' in FIG. 17. FIG. 19 illustrates an example of a cross-sectional configuration taken along a line B-B' in FIG. 17.

It is to be noted that, in reality, the first electrode 11 is coupled neither to the third terminal conductor 3 nor to the fourth terminal conductor 4 in the cross-section along the line B-B' in FIG. 17. However, FIG. 19 illustrates as if the first electrode 11 is coupled to the third terminal conductor 3 and to the fourth terminal conductor 4 in the cross-section along the line B-B', for easy understanding.

As illustrated in FIGS. 18 and 19, a substrate module 100 according to the present example embodiment includes the first coupling conductor 41 and a mounting substrate 70. The first coupling conductor 41 couples two capacitors 10 of capacitors 10 (i.e., 10-1, 10-2, . . . 10-n) together. The mounting substrate 70 may include the DC power supply layer Vcc and the ground layer GND. It is to be noted that, although FIG. 16 illustrates an example of six capacitors 10 (i.e., 10-1, 10-2, . . . 10-6), the number of the capacitor 10 may be less than or more than six.

The first coupling conductor 41 may be a conductor pattern formed on a surface of the mounting substrate 70, for example.

As illustrated in FIGS. 18 and 19, the mounting substrate 70 may include a wiring line 71, a wiring line 72, a wiring line 73, and a wiring line 74. The wiring line 71 and the wiring line 72 may be each a conductor pattern formed on the surface of the mounting substrate 70, for example. The wiring line 73 and the wiring line 74 may be each a metalized through-hole, for example.

Each first terminal conductor 1 of the capacitors 10 (i.e., 10-1, 10-2, . . . 10-n) may be coupled to the DC power supply layer Vcc via the wiring line 71 and the wiring line 73.

Each second terminal conductor 2 of the capacitors 10 (i.e., 10-1, 10-2, . . . 10-n) may be coupled to the ground layer GND via the wiring line 72 and the wiring line 74.

In the first coupling, the capacitors 10 may be disposed to allow all of the respective third terminal conductors 3 and the respective fourth terminal conductors 4 to be arranged in the same direction, i.e., to be arranged laterally.

In the first coupling, the third terminal conductor 3 of the first capacitor (e.g., the capacitor 10-1) of the two capacitors 10 (e.g., the adjacent capacitors 10-1 and 10-2) and the fourth terminal conductor 4 of the second capacitor (e.g., the capacitor 10-2) of the two capacitors 10 (e.g., the adjacent capacitors 10-1 and 10-2) may be intercoupled together via the first coupling conductor 41. This allows the capacitors 10 (i.e., 10-1, 10-2, . . . 10-n) to be cascaded.

Intercoupling the third terminal conductor 3 and the fourth terminal conductor 4 in the two capacitors 10 via the first coupling conductor 41 in this manner makes it possible to mount the capacitors 10 in the smaller mounting area. Further, only the small pattern area of the first coupling conductor 41 suffices.

In FIGS. 16 and 17, the capacitors 10 (i.e., 10-1, 10-2, . . . 10-n) may be cascaded via the first coupling conductors 41. For example, the first coupling conductor 41 that couples a combination of the adjacent capacitors 10-1 and 10-2 is a separate component from the first coupling conductor 41 that couples another combination of the adjacent capacitors 10-2 and 10-3. In contrast, the capacitors 10 (i.e., 10-1, 10-2, . . . 10-n) may be configured to be cascaded via one first coupling conductor 41.

[Second Coupling of First Example]

Figure 20:
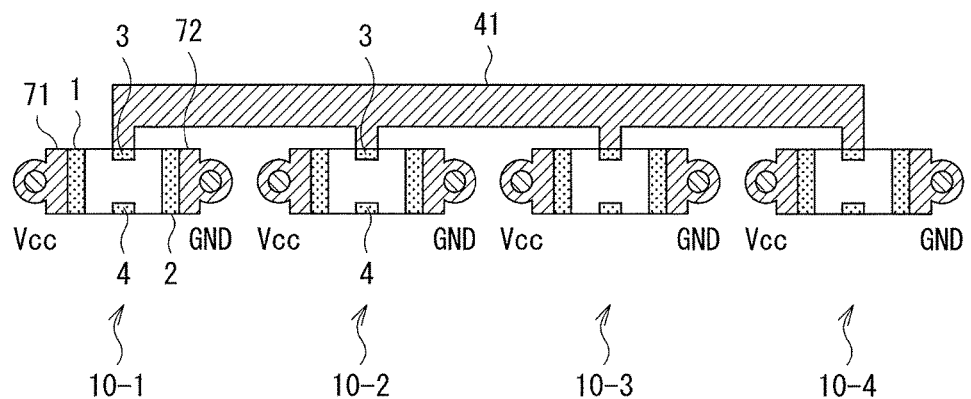
FIG. 20 is a configuration diagram illustrating an example of second coupling in the case where the three or more capacitors according to the first example of the first example embodiment are disposed in parallel.

FIG. 20 illustrates an example of second coupling in the case where the three or more capacitors 10 according to the first example of the first example embodiment are disposed in parallel. It is to be noted that, although FIG. 20 illustrates an example of four capacitors 10 (i.e., 10-1, 10-2, . . . 10-4), the number of the capacitor 10 may be less than or more than four.

In the second coupling, the capacitors 10 may be disposed to allow all of the respective first terminal conductors 1 and the respective second terminal conductors 2 to be arranged in the same direction, i.e., to be arranged laterally. The mounting substrate 70 may have a structure that is substantially similar to that illustrated in FIGS. 18 and 19.

In the second coupling, the respective third terminal conductors 3 of the capacitors 10 may be intercoupled together via the first coupling conductor 41.

[Third Coupling of First Example]

Figure 21:
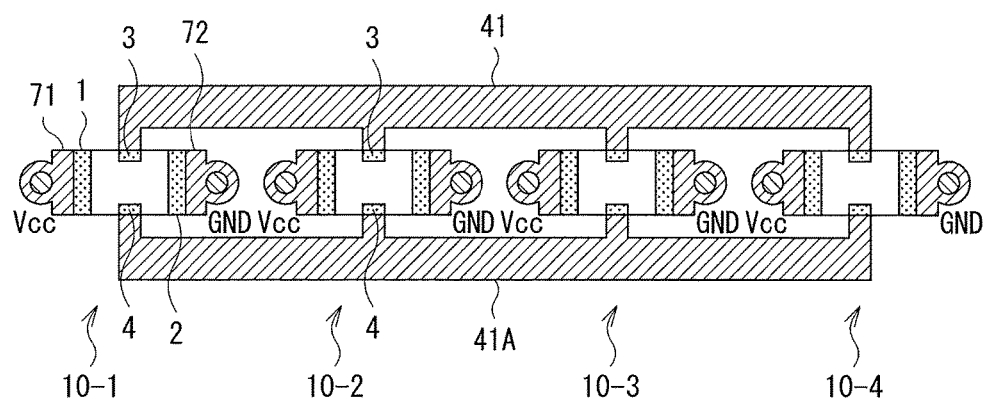
FIG. 21 is a configuration diagram illustrating an example of third coupling in the case where the three or more capacitors according to the first example of the first example embodiment are disposed in parallel.

FIG. 21 illustrates an example of third coupling in the case where the three or more capacitors 10 according to the first example of the first example embodiment are disposed in parallel. It is to be noted that, although FIG. 21 illustrates an example of four capacitors 10 (i.e., 10-1, 10-2, . . . 10-4), the number of the capacitor 10 may be less than or more than four.

In the third coupling, the capacitors 10 may be disposed to allow all of the respective first terminal conductors 1 and the respective second terminal conductors 2 to be arranged in the same direction, i.e., to be arranged laterally.

In the third coupling, the substrate module 100 may further include a second coupling conductor 41A. The second coupling conductor 41A may be a conductor pattern formed on the surface of the mounting substrate 70, for example. Any other structure may be substantially similar to that illustrated in FIGS. 18 and 19.

In the third coupling, the respective third terminal conductors 3 of the capacitors 10 may be intercoupled together via the first coupling conductor 41. Further, the respective fourth terminal conductors 4 of the capacitors 10 may be intercoupled together via the second coupling conductor 41A.

1.3.2 Second Example

Figure 22:
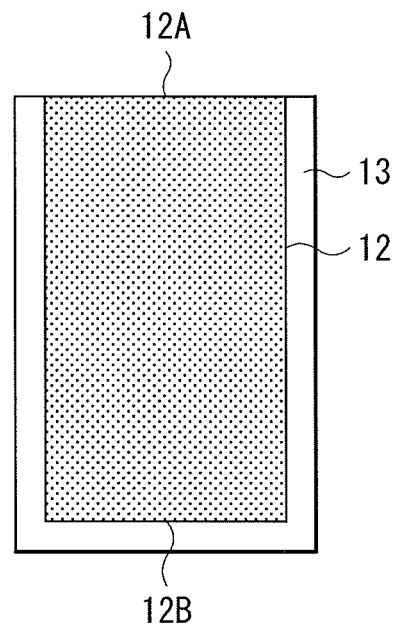
FIG. 22 is a plan view of a configuration example of the second electrode in a capacitor according to a second example of the first example embodiment.
Figure 23:
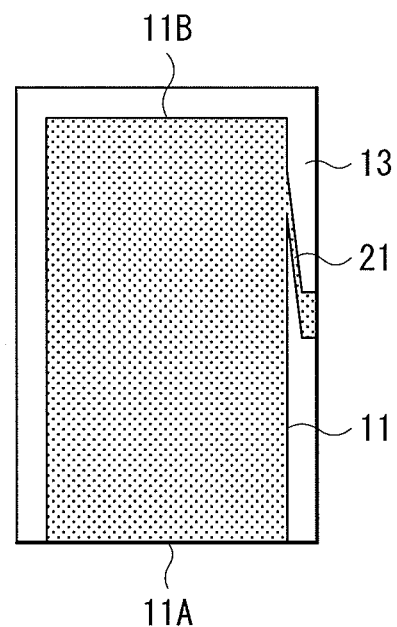
FIG. 23 is a plan view of a configuration example of the first electrode in the capacitor according to the second example of the first example embodiment.
Figure 24:
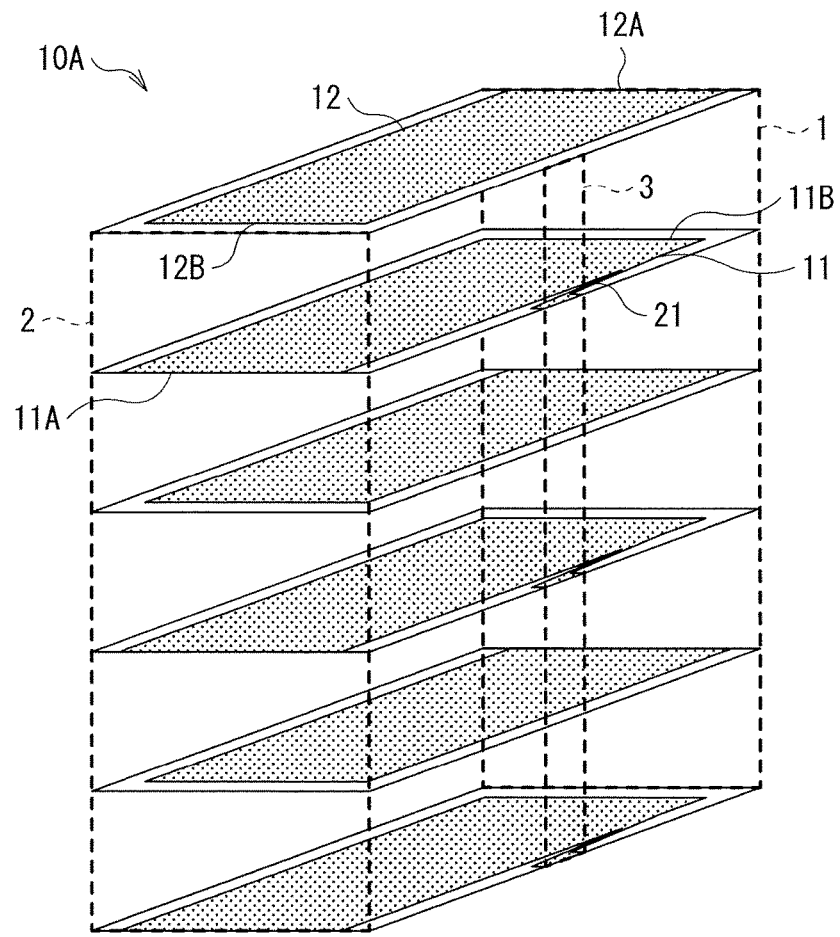
FIG. 24 is an exploded perspective view of an example of an overall configuration of the capacitor according to the second example of the first example embodiment.

FIG. 22 illustrates a configuration example of the second electrode 12 in a capacitor 10A according to a second example of the first example embodiment. FIG. 23 illustrates a configuration example of the first electrode 11 in the capacitor 10A according to the second example. FIG. 24 illustrates an example of an overall configuration of the capacitor 10A according to the second example.

The capacitor 10A according to the second example includes the first electrode 11, the second electrode 12, the first terminal conductor 1, the second terminal conductor 2, and the third terminal conductor 3.

The capacitor 10A according to the second example may have a structure substantially similar to that of the capacitor 10 according to the first example illustrated in FIGS. 9 to 12, except that the fourth terminal conductor 4 and the led-out part 22 of the first electrode 11 are omitted.

Substantially similarly to the structure of the above-mentioned FIG. 12, the third terminal conductor 3 may be formed at least on a third surface of the substantially cuboid shape. Further, the third terminal conductor 3 may be formed to extend to at least another surface that is in contact with the third surface of the substantially cuboid shape.

[First Coupling of Second Example]

Figure 25:
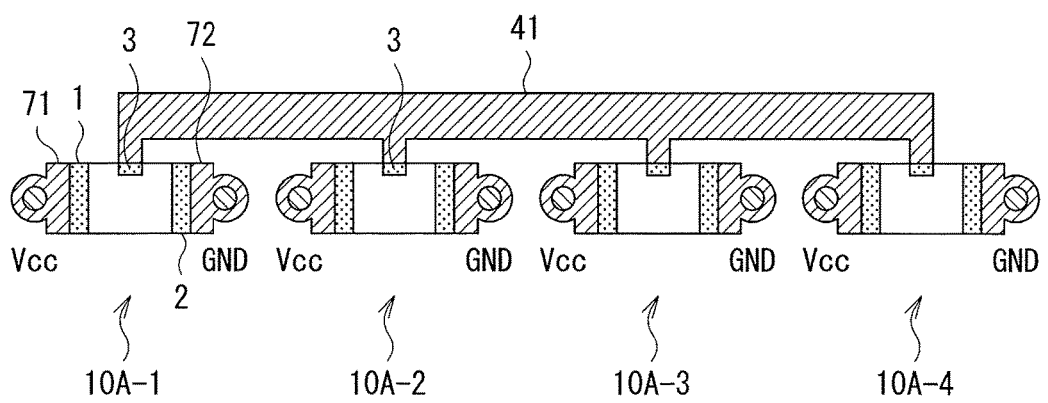
FIG. 25 is a configuration diagram illustrating an example of first coupling in a case where three or more capacitors according to the second example of the first example embodiment are disposed in parallel.

FIG. 25 illustrates an example of first coupling in a case where three or more capacitors 10A according to the second example of the first example embodiment are disposed in parallel. It is to be noted that, although FIG. 25 illustrates an example of four capacitors 10A (i.e., 10-1, 10-2, . . . 10-4), the number of the capacitor 10A may be less than or more than four.

In the first coupling, the capacitors 10A may be disposed to allow all of the respective first terminal conductors 1 and the respective second terminal conductors 2 to be arranged in the same direction, i.e., to be arranged laterally. The mounting substrate 70 may have a structure that is substantially similar to that illustrated in FIGS. 18 and 19.

In the first coupling, the respective third terminal conductors 3 of the capacitors 10A may be intercoupled together via the first coupling conductor 41.

[Second Coupling of Second Example]

Figure 26:
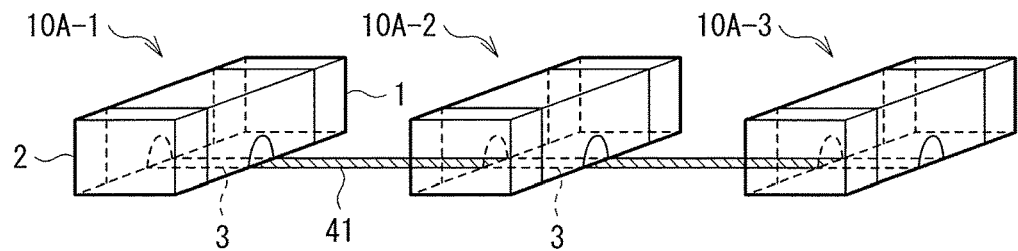
FIG. 26 is a configuration diagram illustrating an example of second coupling in the case where the three or more capacitors according to the second example of the first example embodiment are disposed in parallel.

FIG. 26 illustrates an example of second coupling in the case where the three or more capacitors 10A according to the second example of the first example embodiment are disposed in parallel. It is to be noted that, although FIG. 26 illustrates an example of three capacitors 10A (i.e., 10-1, 10-2, and 10-3), the number of the capacitor 10A may be less than or more than three.

In the second coupling, the capacitors 10A may be disposed to allow respective third surfaces, set as bottom surfaces, on which the third terminal conductors 3 are formed to come into contact with the surface of the mounting substrate 70. The mounting substrate 70 may have a structure that is substantially similar to that illustrated in FIGS. 18 and 19.

In the second coupling, the third terminal conductors 3 formed on the respective third surfaces of the capacitors 10A may be intercoupled together via the first coupling conductor 41.

2. Second Example Embodiment

Description is given next of the capacitor and the substrate module according to the second example embodiment of the disclosure. It is to be noted that, in the following, parts that are substantially the same as the components of the capacitor and the substrate module according to the foregoing first example embodiment are denoted with the same reference numerals, and descriptions thereof are omitted where appropriate.

Figure 27:
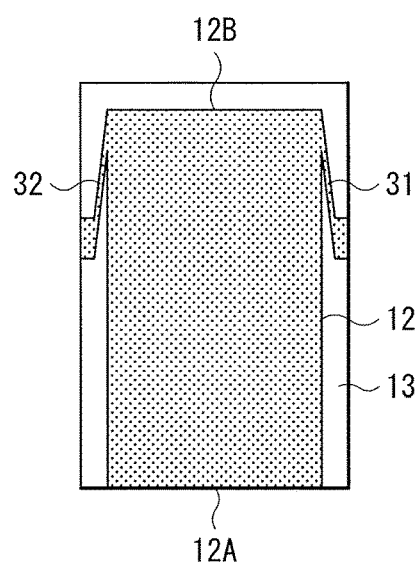
FIG. 27 is a plan view of a configuration example of the second electrode in a capacitor according to a second example embodiment.
Figure 28:
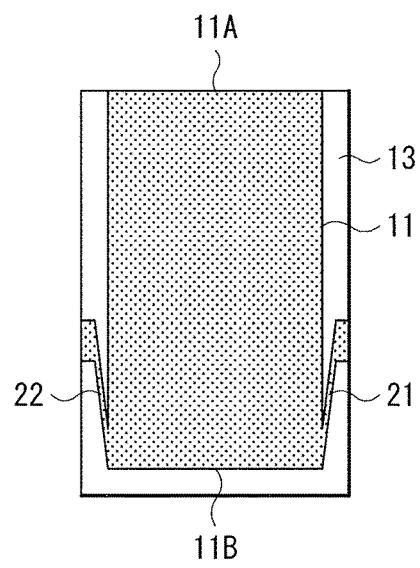
FIG. 28 is a plan view of a configuration example of the first electrode in the capacitor according to the second example embodiment.
Figure 29:
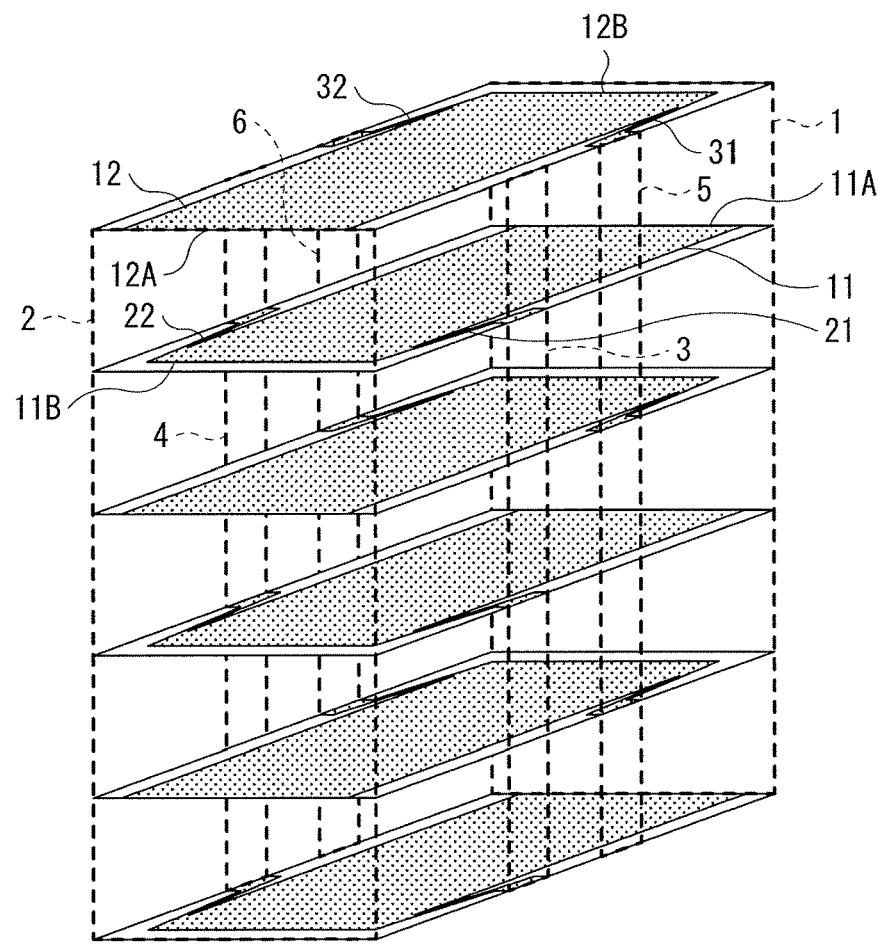
FIG. 29 is an exploded perspective view of an example of an overall configuration of the capacitor according to the second example embodiment.
Figure 30:
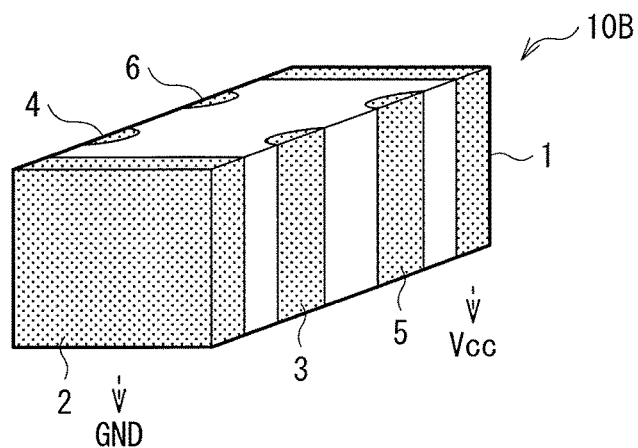
FIG. 30 is a perspective view of an example of an appearance of the capacitor according to the second example embodiment.

FIG. 27 illustrates a configuration example of the second electrode 12 in a capacitor 10B according to the second example embodiment. FIG. 28 illustrates a configuration example of the first electrode 11 in the capacitor 10B. FIG. 29 illustrates an example of an overall configuration of the capacitor 10B. FIG. 30 illustrates an example of an appearance of the capacitor 10B.

The capacitor 10B according to the present example embodiment may further include a fifth terminal conductor 5 and a sixth terminal conductor 6, in addition to the configuration of the capacitor 10 illustrated in the above-mentioned FIGS. 9 to 12.

As illustrated in FIG. 27, in the capacitor 10B, the second electrode 12 may include a led-out part 31 that couples the second electrode 12 to the fifth terminal conductor 5, and a led-out part 32 that couples the second electrode 12 to the sixth terminal conductor 6.

As illustrated in FIG. 30, the capacitor 10B as a whole may have a substantially cuboid shape.

As illustrated in FIG. 30, the fifth terminal conductor 5 may be formed at least on a third surface of the substantially cuboid shape at a position different from that of the third terminal conductor 3. Further, the fifth terminal conductor 5 may be formed to extend to at least another surface that is in contact with the third surface of the substantially cuboid shape.

As illustrated in FIG. 30, the sixth terminal conductor 6 may be formed at least on a fourth surface of the substantially cuboid shape at a position different from that of the fourth terminal conductor 4. The fourth surface may face the third surface. Further, the sixth terminal conductor 6 may be formed to extend to at least another surface that is in contact with the fourth surface of the substantially cuboid shape.

The fifth terminal conductor 5 may be coupled to the second electrode 12 at a coupling position different from that of the second terminal conductor 2. As illustrated in a coupling described later (e.g., in FIG. 31), the fifth terminal conductor 5 may be coupled to a second coupling conductor 42 formed on the mounting substrate, for example. This allows two capacitors 10B (e.g., adjacent capacitors 10B-1 and 10B-2) to be coupled together via the second coupling conductor 42, as illustrated in the coupling described later (e.g., in FIG. 31).

In one embodiment, the fifth terminal conductor 5 may be coupled to the second electrode 12 at a position closer to the open end 12B of the second electrode 12 than an intermediate position between a coupling position (i.e., the power supply-coupling end 12A) of the second terminal conductor 2 in the second electrode 12 and the open end 12B, for a reason similar to that of the third terminal conductor 3.

The sixth terminal conductor 6 may be coupled to the second electrode 12 at a coupling position different from those of the second terminal conductor 2 and the fifth terminal conductor 5. As illustrated in the coupling described later (e.g., in FIG. 31), the sixth terminal conductor 6 may be coupled to the second coupling conductor 42 formed on the mounting substrate, for example. This allows the two capacitors 10B (e.g., the adjacent capacitors 10B-1 and 10B-2) to be coupled together via the second coupling conductor 42, as illustrated in the coupling described later (e.g., in FIG. 31).

In one embodiment, the sixth terminal conductor 6 may be coupled to the second electrode 12 at a position closer to the open end 12B of the second electrode 12 than the intermediate position between the coupling position (i.e., the power supply-coupling end 12A) of the second terminal conductor 2 in the second electrode 12 and the open end 12B, for the reason similar to that of the third terminal conductor 3.

[Example of Coupling]

Figure 35:
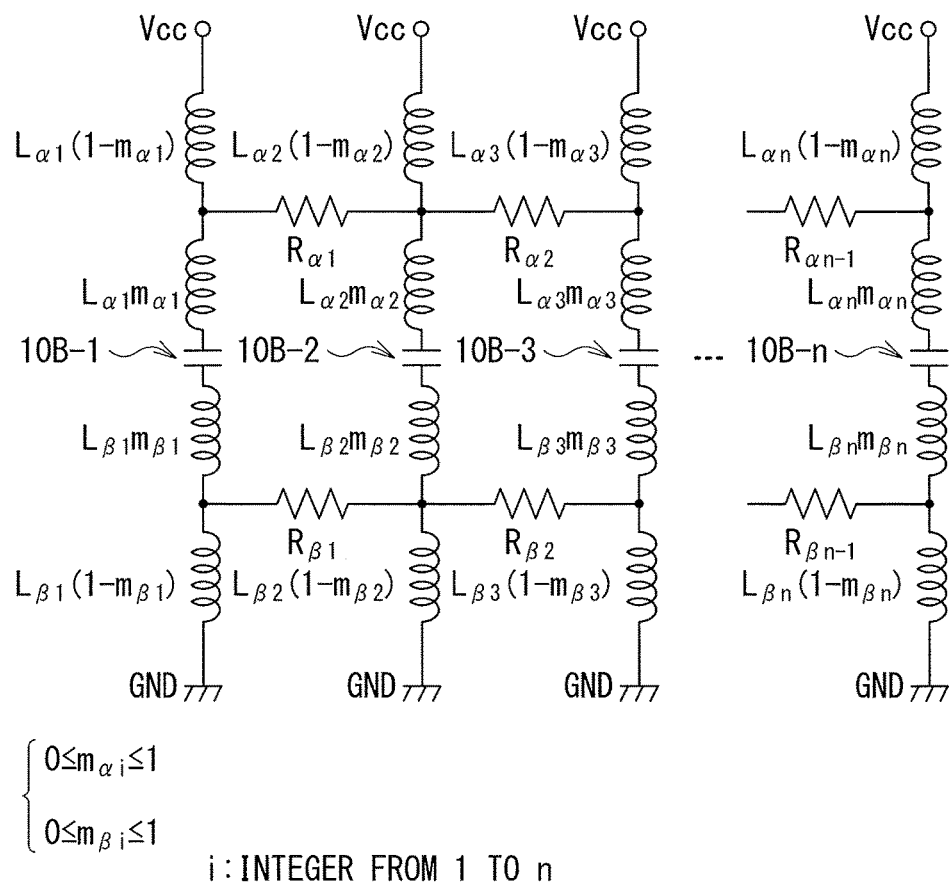
FIG. 35 is a configuration diagram illustrating an equivalent circuit in a case where the capacitors according to the second example embodiment are disposed in parallel.

FIG. 35 illustrates an example of an equivalent circuit in a case where three or more capacitors 10B (e.g., the adjacent capacitors 10B-1, 10B-2, ... 10B-n) according to the second example embodiment are disposed in parallel. Description is given below of a coupling that achieves the equivalent circuit of FIG. 35. In addition, description is given of the substrate module according to the second example embodiment.

Figure 31:
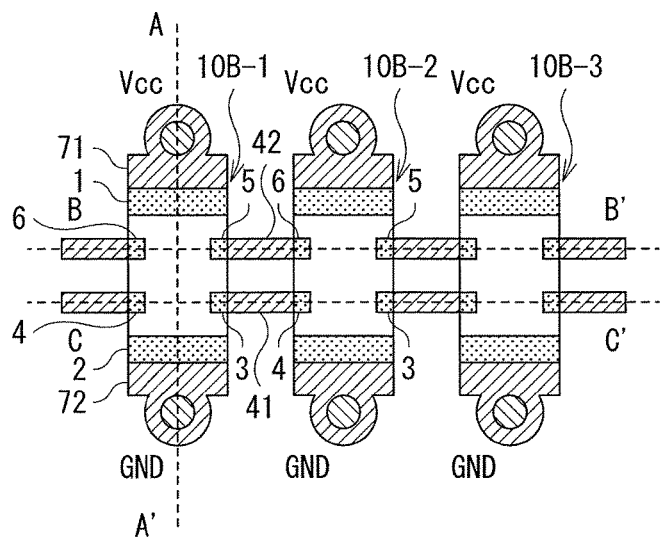
FIG. 31 is a configuration diagram illustrating a coupling in a case where capacitors according to the second example embodiment are disposed in parallel.
Figure 32:
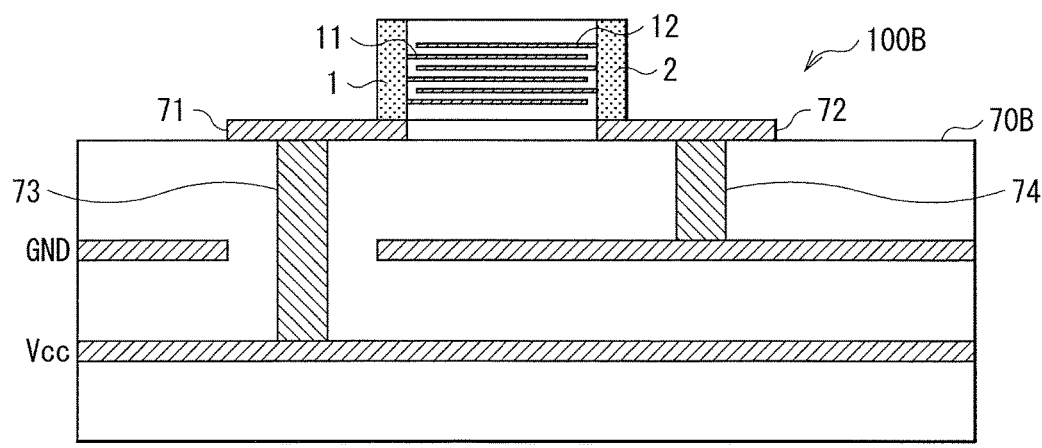
FIG. 32 is a cross-sectional view of an example of a cross-sectional configuration taken along a line A-A' in FIG. 31.
Figure 33:
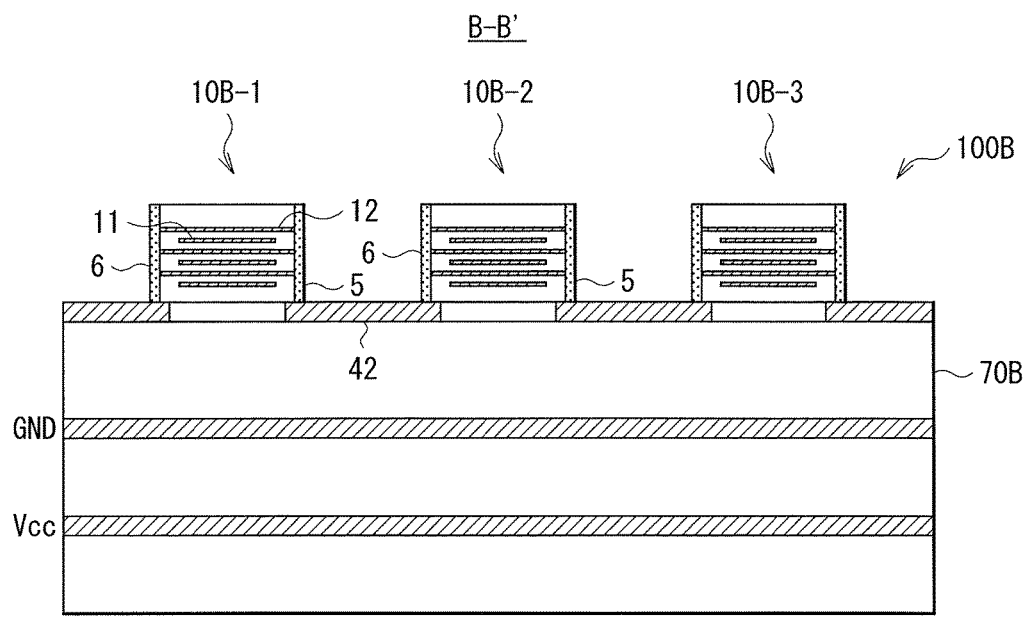
FIG. 33 is a cross-sectional view of an example of a cross-sectional configuration taken along a line B-B' in FIG. 31.
Figure 34:
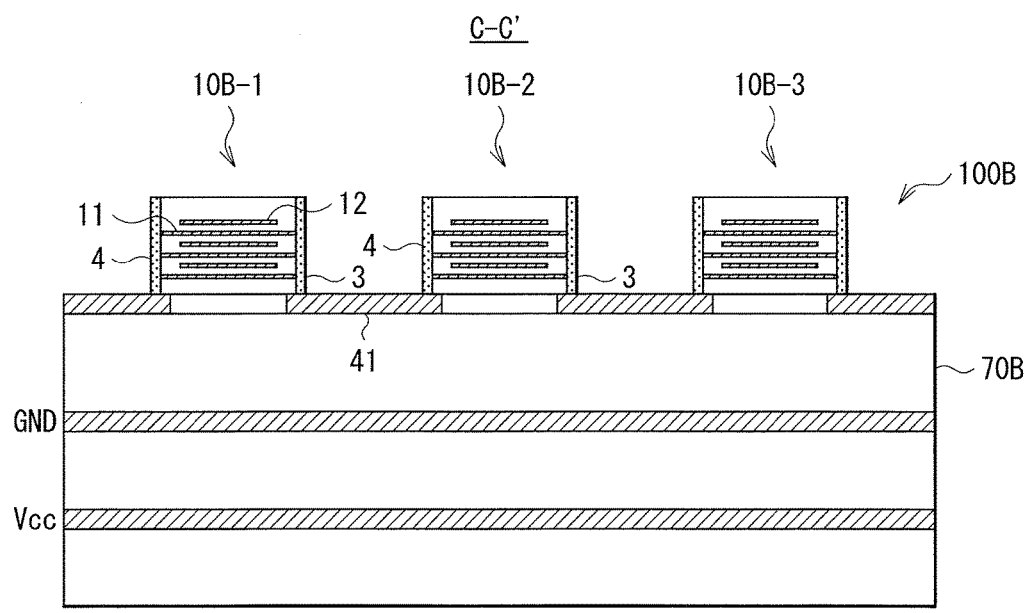
FIG. 34 is a cross-sectional view of an example of a cross-sectional configuration taken along a line C-C' in FIG. 31.

FIG. 31 illustrates a coupling in a case where capacitors 10B according to the second example embodiment are disposed in parallel. FIG. 32 illustrates an example of a cross-sectional configuration taken along a line A-A' in FIG. 31. FIG. 33 illustrates an example of a cross-sectional configuration taken along a line B-B' in FIG. 31. FIG. 34 illustrates an example of a cross-sectional configuration taken along a line C-C' in FIG. 31. In reality, the second electrode 12 is coupled neither to the fifth terminal conductor 5 nor to the sixth terminal conductor 6 in the cross-section along the line B-B' in FIG. 31. However, FIG. 33 illustrates as if the second electrode 12 if coupled to the fifth terminal conductor 5 and to the sixth terminal conductor 6 in the cross-section along the line B-B', for easy understanding. Likewise, the first electrode 11 is coupled neither to the third terminal conductor 3 nor to the fourth terminal conductor 4 in the cross-section along the line C-C' in FIG. 31, in reality. However, FIG. 34 illustrates as if the first electrode 11 is coupled to the third terminal conductor 3 and to the fourth terminal conductor 4 in the cross-section along the line C-C', for easy understanding.

As illustrated in FIGS. 32 to 34, a substrate module 100B according to the present example embodiment may include the first coupling conductor 41, the second coupling conductor 42, and a mounting substrate 70B. The first coupling conductor 41 and the second coupling conductor 42 may each couple the two capacitors 10 of capacitors 10B together. The mounting substrate 70B may include the DC power supply layer Vcc and the ground layer GND. It is to be noted that, although FIG. 31 illustrates an example of three capacitors 10B (i.e., 10B-1, 10B-2, and 10B-3), the number of the capacitor 10B may be less than or more than three.

The first coupling conductor 41 and the second coupling conductor 42 may be each a conductor pattern formed on a surface of the mounting substrate 70B, for example.

As illustrated in FIGS. 32 to 34, the mounting substrate 70B may include the wiring line 71, the wiring line 72, the wiring line 73, and the wiring line 74. The wiring line 71 and the wiring line 72 may be each a conductor pattern formed on the surface of the mounting substrate 70B, for example. The wiring line 73 and the wiring line 74 may be each a metalized through-hole, for example.

In the coupling, the capacitors 10B may be disposed to allow all of the respective third terminal conductors 3 and the respective fourth terminal conductors 4 to be arranged in the same direction, i.e., to be arranged laterally. Further, the capacitors 10B may be disposed to allow all of the respective fifth terminal conductors 5 and the respective sixth terminal conductors 6 to be arranged in the same direction, i.e., to be arranged laterally.

In the coupling, the third terminal conductor 3 of the first capacitor (e.g., the capacitor 10B-1) of the two capacitors 10B (e.g., the adjacent capacitors 10B-1 and 10B-2) and the fourth terminal conductor 4 of the second capacitor (e.g., the capacitor 10B-2) of the two capacitors 10B (e.g., the adjacent capacitors 10B-1 and 10B-2) may be intercoupled together via the first coupling conductor 41.

Further, the fifth terminal conductor 5 of the first capacitor (e.g., the capacitor 10B-1) of the two capacitors 10B (e.g., the adjacent capacitors 10B-1 and 10B-2) and the sixth terminal conductor 6 of the second capacitor (e.g., the capacitor 10B-2) of the two capacitors 10B (e.g., the adjacent capacitors 10B-1 and 10B-2) may be intercoupled together via the second coupling conductor 42.

This allows the capacitors 10B (i.e., 10B-1, 10B-2, . . . 10B-n) to be cascaded.

In FIGS. 31 to 34, the capacitors 10B (i.e., 10B-1, 10B-2, . . . 10B-n) may be cascaded via the first coupling conductors 41 and via the second coupling conductors 42. For example, the first coupling conductor 41 and the second coupling conductors 42 that each couple a combination of the adjacent capacitors 10B-1 and 10B-2 are separate components, respectively, from the first coupling conductor 41 and the second coupling conductors 42 that each couple another combination of the adjacent capacitors 10B-2 and 10B-3. In contrast, the capacitors 10B (i.e., 10B-1, 10B-2, . . . 10B-n) may be configured to be cascaded via one first coupling conductor 41 and one second coupling conductor 42.

Other configurations are substantially similar to those of the capacitor 10 and the substrate module 100 according to the foregoing first example embodiment.

[Workings of Second Example Embodiment]

Figure 36:
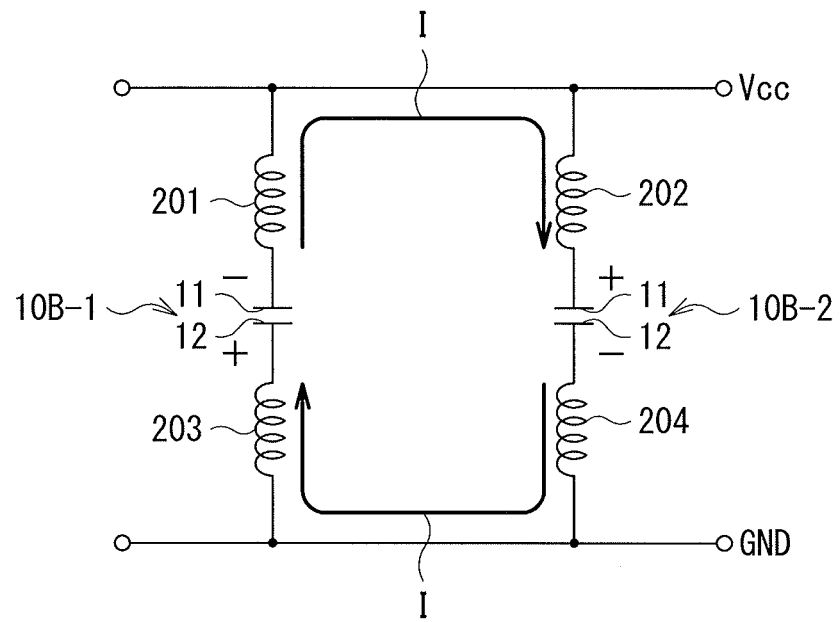
FIG. 36 is an equivalent circuit diagram illustrating a circuit of a comparative example in contrast to the coupling of the capacitors according to the second example embodiment.

FIG. 36 illustrates a circuit of a comparative example in contrast to the coupling of the capacitors 10B according to the second example embodiment.

In the circuit of the comparative example of FIG. 36, the two capacitors 10B-1 and 10B-2 are disposed in parallel between the ground layer GND and the DC power supply layer Vcc.

The inductor 201 such as the equivalent series inductance is present between the first electrode 11 of the capacitor 10B-1 and the DC power supply layer Vcc. An inductor 203 such as the equivalent series inductance is present between the second electrode 12 of the capacitor 10B-1 and the ground layer GND. Likewise, the inductor 202 such as the equivalent series inductance is present between the first electrode 11 of the capacitor 10B-2 and the DC power supply layer Vcc. An inductor 204 such as the equivalent series inductance is present between the second electrode 12 of the capacitor 10B-2 and the ground layer GND.

As illustrated in FIG. 36, upon antiresonance, the current I flows along a path of the first electrode 11 of the capacitor 10B-1, the inductor 201, the DC power supply layer Vcc, the inductor 202, and the first electrode 11 of the capacitor 10B-2. Further, upon the antiresonance, the current I may flow also along a path of the second electrode 12 of the capacitor 10B-2, the inductor 204, the ground layer GND, the inductor 203, and the second electrode 12 of the capacitor 10B-1.

It is to be noted that the current I that flows upon the antiresonance is an alternating current and that an orientation of the flowing current I may be possibly opposite to the orientations illustrated in FIG. 36. FIG. 36 exemplifies a case where the current I flows at a moment when the first electrode 11 of the capacitor 10B-1 is turned into minus (−) and the second electrode 12 of the capacitor 10B-1 is turned into plus (+) and when the first electrode 11 of the capacitor 10B-2 is turned into plus (+) and the second electrode 12 of the capacitor 10B-2 is turned into minus (−).

Figure 37:
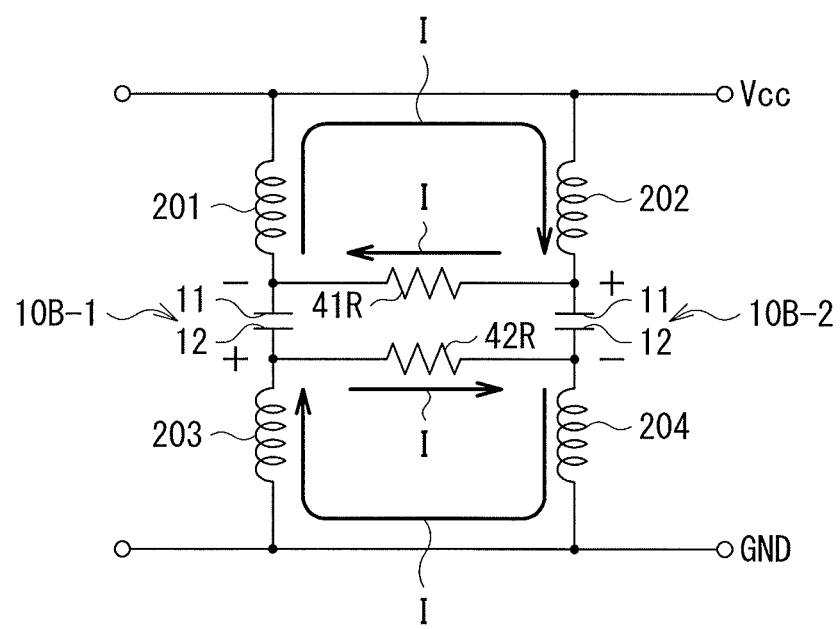
FIG. 37 is an equivalent circuit diagram illustrating an overview of the coupling of the capacitors according to the second example embodiment.
Figure 38:
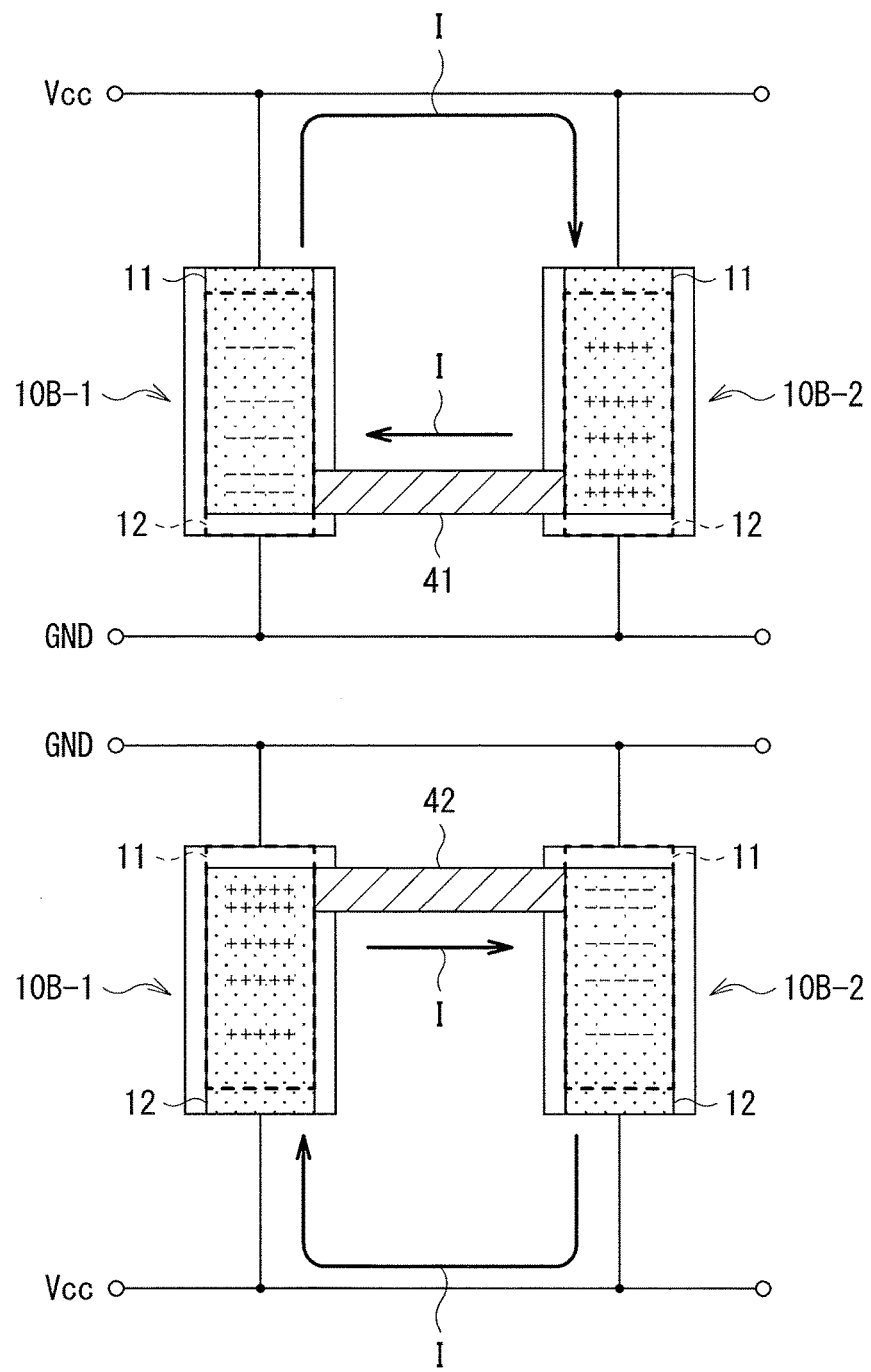
FIG. 38 is a configuration diagram illustrating an example of a configuration that allows for achievement of the coupling illustrated in FIG. 37.

FIG. 37 illustrates an overview of a coupling of the capacitors 10B according to the second example embodiment, using an equivalent circuit. FIG. 38 illustrates an example of a configuration that allows for achievement of the coupling illustrated in FIG. 37.

In the circuit of FIG. 37, the first electrode 11 of the capacitor 10B-1 and the first electrode 11 of the capacitor 10B-2 may be intercoupled together via the resistance 41R that occurs due to the first coupling conductor 41, in contrast to the circuit of the comparative example of FIG. 36. Further, in the circuit of FIG. 37, the second electrode 12 of the capacitor 10B-1 and the second electrode 12 of the capacitor 10B-2 may be intercoupled together via a resistance 42R configured by the second coupling conductor 42, in contrast to the circuit of the comparative example of FIG. 36.

In the coupling of the capacitors 10B according to the second example embodiment, upon the antiresonance, the current I flows along a path of the first electrode 11 of the capacitor 10B-1, the inductor 201, the DC power supply layer Vcc, the inductor 202, the first electrode 11 of the capacitor 10B-2, and the resistance 41R (i.e., the first coupling conductor 41), as illustrated in FIGS. 37 and 38. The current I thus flows through the resistance 41R, whereby the energy of the antiresonance is converted into heat, making it possible to suppress the occurrence of the antiresonance.

Upon the antiresonance, the current I may flow also along a path of the second electrode 12 of the capacitor 10B-2, the inductor 204, the ground layer GND, the inductor 203, the second electrode 12 of the capacitor 10B-1, and the resistance 42R (i.e., the second coupling conductor 42). The current I thus flows through the resistance 42R, whereby the energy of the antiresonance is converted into heat, making it possible to suppress the occurrence of the antiresonance.

It is to be noted that the current I that flows upon the antiresonance is an alternating current and that an orientation of the flowing current I may be possibly opposite to the orientations illustrated in each of FIGS. 37 and 38. FIGS. 37 and 38 each exemplify the case where the current I flows at a moment when the first electrode 11 of the capacitor 10B-1 is turned into minus (−) and the second electrode 12 of the capacitor 10B-1 is turned into plus (+) and when the first electrode 11 of the capacitor 10B-2 is turned into plus (+) and the second electrode 12 of the capacitor 10B-2 is turned into minus (−).

Modification Example of Second Example Embodiment

Figure 39:
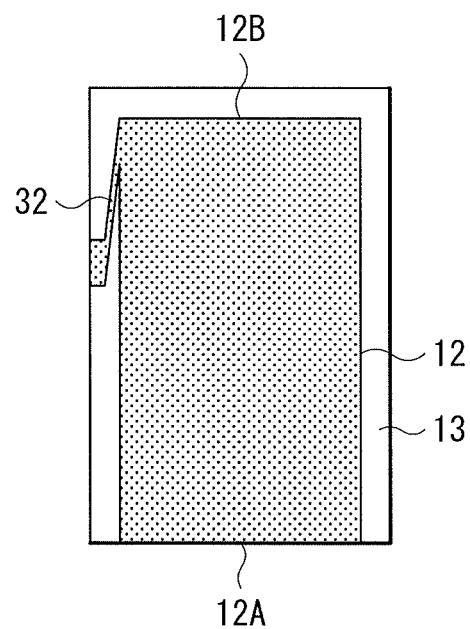
FIG. 39 is a plan view of a configuration example of the second electrode in a capacitor according to a modification example of the second example embodiment.
Figure 40:
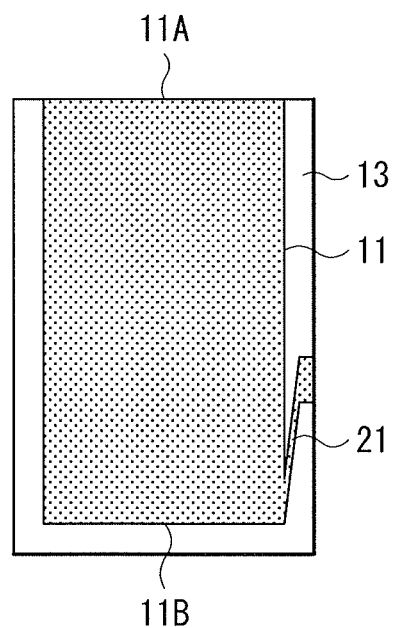
FIG. 40 is a plan view of a configuration example of the first electrode in the capacitor according to the modification example of the second example embodiment.
Figure 41:
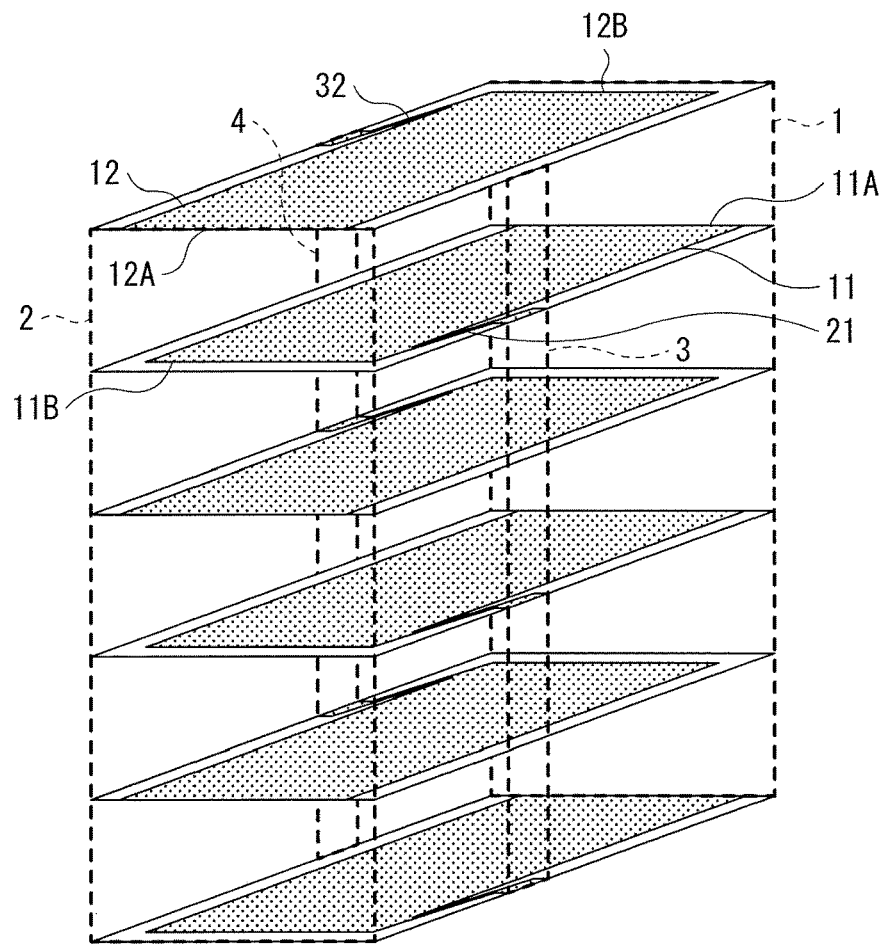
FIG. 41 is an exploded perspective view of an example of an overall configuration of the capacitor according to the modification example of the second example embodiment.
Figure 42:
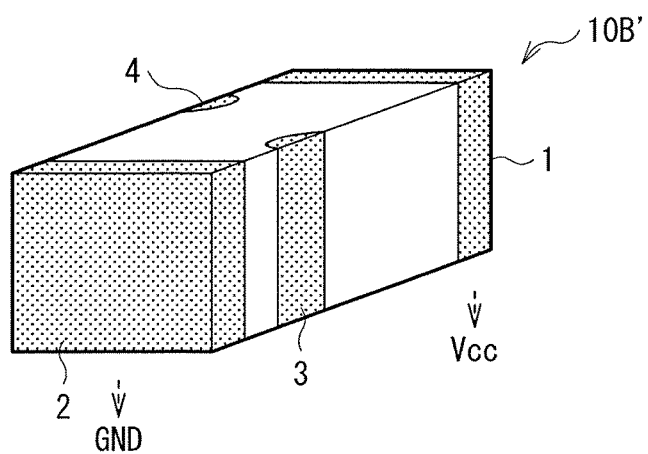
FIG. 42 is a perspective view of an example of an appearance of the capacitor according to the modification example of the second example embodiment.

FIG. 39 illustrates a configuration example of the second electrode 12 in a capacitor 10B' according to a modification example of the second example embodiment. FIG. 40 illustrates a configuration example of the first electrode 11 in the capacitor 10B'. FIG. 41 illustrates an example of an overall configuration of the capacitor 10B'. FIG. 42 illustrates an example of an appearance of the capacitor 10B'.

The capacitor 10B' according to the present modification example may have a configuration in which the fifth terminal conductor 5 is eliminated from the configuration of the capacitor 10B illustrated in the above-mentioned FIGS. 27 to 30. Further, the capacitor 10B' may eliminate the fourth terminal conductor 4 of the capacitor 10B. The capacitor 10B' may instead use the sixth terminal conductor 6 of the capacitor 10B as the fourth terminal conductor 4 to allow the fourth terminal conductor 4 to be coupled to the second electrode 12.

In the capacitor 10B', the second electrode 12 may include the led-out part 32 that couples the second electrode 12 to the fourth terminal conductor 4, as illustrated in FIG. 39.

In the capacitor 10B', the first electrode 11 may include the led-out part 21 that couples the first electrode 11 to the third terminal conductor 3, as illustrated in FIG. 40.

In the capacitor 10B', the fourth terminal conductor 4 may be formed at least on a fourth surface of the substantially cuboid shape, as illustrated in FIG. 42. The fourth surface may face a third surface on which the third terminal conductor 3 is formed. Further, the fourth terminal conductor 4 may be formed to extend to at least another surface that is in contact with the fourth surface of the substantially cuboid shape.

In the capacitor 10B', the fourth terminal conductor 4 may be coupled to the second electrode 12 at a coupling position different from that of the second terminal conductor 2. As illustrated in a coupling described later (in FIG. 43), the fourth terminal conductor 4 may be coupled to the second coupling conductor 42 formed on the mounting substrate, for example. This allows the two capacitors 10B' (e.g., adjacent capacitors 10B'-1 and 10B'-2) to be coupled together via the second coupling conductor 42, as illustrated in the coupling described later (in FIG. 43).

In one embodiment, the fourth terminal conductor 4 may be coupled to the second electrode 12 at a position closer to the open end 12B of the second electrode 12 than an intermediate position between a coupling position (i.e., the power supply-coupling end 12A) of the second terminal conductor 2 in the second electrode 12 and the open end 12B, for a reason similar to that of the third terminal conductor 3.

Figure 43:
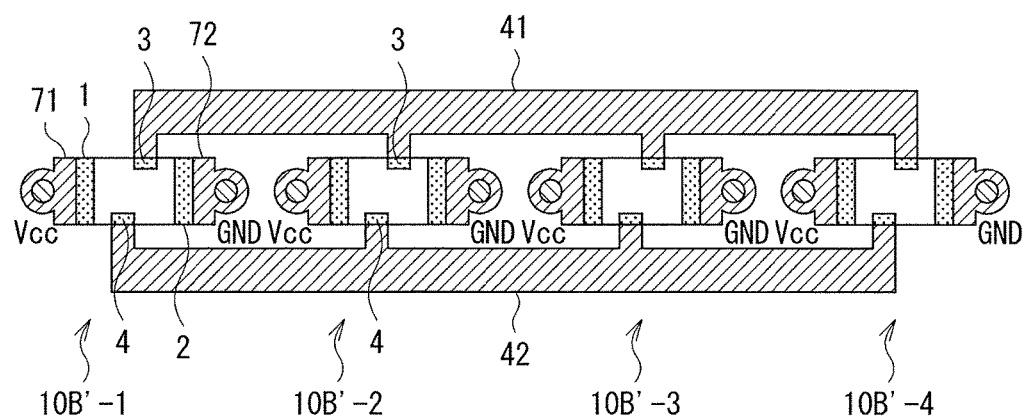
FIG. 43 is a configuration diagram illustrating a coupling in a case where capacitors according to the modification example of the second example embodiment are disposed in parallel.

FIG. 43 illustrates a coupling in a case where capacitors 10B' are disposed in parallel. It is to be noted that, although FIG. 43 illustrates an example of four capacitors 10B' (i.e., 10B'-1, 10B'-2, ... 10B'-4), the number of the capacitor 10B' may be less than or more than four.

In the coupling, the capacitors 10B' may be disposed to allow all of the respective first terminal conductors 1 and the respective second terminal conductors 2 to be arranged in the same direction, i.e., to be arranged laterally.

In the coupling, the respective third terminal conductors 3 of the capacitors 10B' may be intercoupled together via the first coupling conductor 41. Further, the respective fourth terminal conductors 4 of the capacitors 10B' may be intercoupled together via the second coupling conductor 42.

3. Third Example Embodiment

Description is given next of the capacitor and the substrate module according to the third example embodiment of the disclosure. It is to be noted that, in the following, parts that are substantially the same as the components of the capacitor and the substrate module according to the foregoing first or second example embodiment are denoted with the same reference numerals, and descriptions thereof are omitted where appropriate.

[Overview of Electrolytic Capacitor]

The capacitor according to the third example embodiment of the disclosure relates to an electrolytic capacitor. Description is given first of a configuration example of an electrolytic capacitor according to a comparative example, with reference to FIGS. 44 and 45.

The electrolytic capacitor according to the comparative example includes a package 721, a capacitor main body 720 disposed inside the package 721, and a sealing member 722 that seals the capacitor main body 720 inside the package 721. The electrolytic capacitor according to the comparative example further includes the first terminal conductor 1 and the second terminal conductor 2 each having one end that is coupled to the capacitor main body 720 via the sealing member 722.

Figure 45:
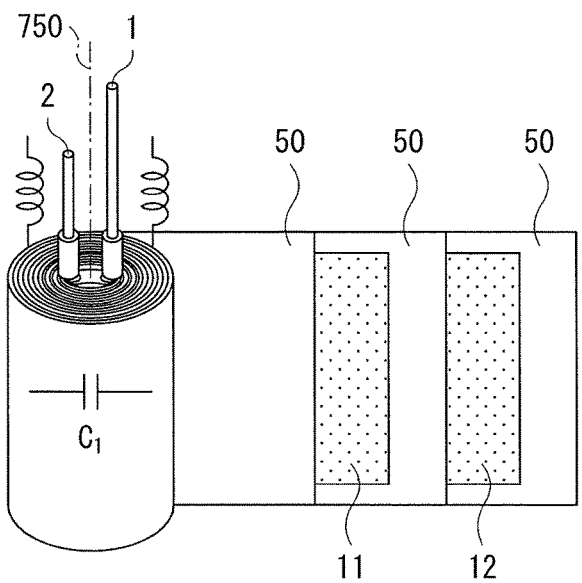
FIG. 45 is a configuration diagram illustrating a configuration example of the electrolytic capacitor according to the comparative example.

As illustrated in FIG. 45, the capacitor main body 720 includes the first electrode 11, the second electrode 12, and a separator 50. The first electrode 11 and the second electrode 12 are each configured by an aluminum foil, for example. The first electrode 11 serves as a positive electrode, for example, and the second electrode 12 serves as a negative electrode, for example. The separator 50 is configured by an electrolytic sheet, for example.

The first electrode 11 and the second electrode 12 face each other, and are spaced apart with the separator 50 being interposed therebetween, in order to avoid mutual contact. The first electrode 11, the separator 50, and the second electrode 12 are wound in an eddy shape around a rotational axis 750 inside the package 721.

One end of the first terminal conductor 1 is coupled to the first electrode 11, and a part of the first terminal conductor 1 including the other end is led out of the package 721. One end of the second terminal conductor 2 is coupled to the second electrode 12, and a part of the second terminal conductor 2 including the other end is led out of the package 721.

In the electrolytic capacitor according to the comparative example, the capacitor main body 720 forms a capacitor $C_1$. In the electrolytic capacitor according to the comparative example, there are respective parasitic inductances (i.e., equivalent series inductances) provided by the first terminal conductor 1, the second terminal conductor 2, the first electrode 11, and the second electrode 12. The electrolytic capacitor according to the comparative example is superior in low-frequency characteristics because of a large capacity of the capacitor $C_1$.

[Configuration Example of Capacitor According to Third Example Embodiment]

Description is given next of a configuration example of the capacitor according to the third example embodiment of the disclosure. As illustrated in each of configuration examples described below, the capacitor according to the third example embodiment differs from the electrolytic capacitor according to the foregoing comparative example mainly in the configuration of the terminal conductor. The capacitor according to the third example embodiment includes the first terminal conductor 1 and the second terminal conductor 2. The capacitor according to the third example embodiment further includes one or more terminal conductors, in addition to the first terminal conductor 1 and the second terminal conductor 2.

It is to be noted that, in the following, parts that are substantially the same as the components of the electrolytic capacitor according to the foregoing comparative example are denoted with the same reference numerals, and descriptions thereof are omitted where appropriate. Further, description is given mainly of a configuration of a main part of the capacitor main body 720 part, in each of the following configuration examples.

First Configuration Example

Figure 46:
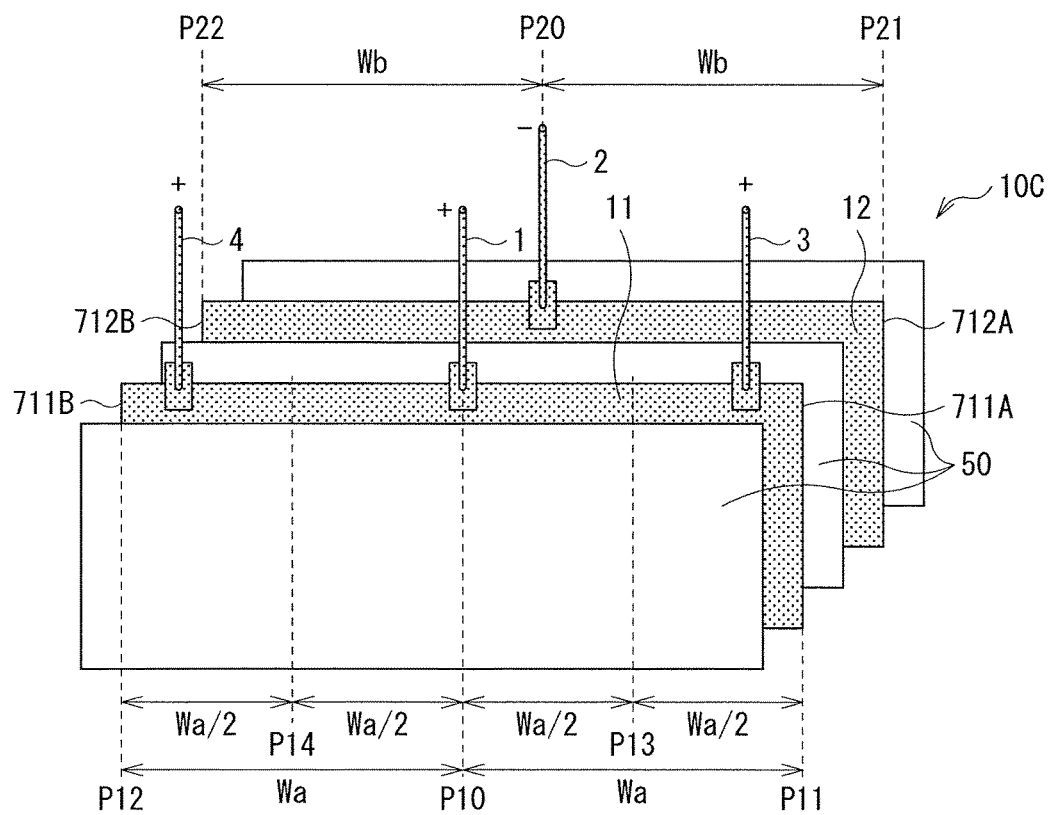
FIG. 46 is a main part configuration diagram illustrating a first configuration example of a capacitor according to a third example embodiment.
Figure 47:
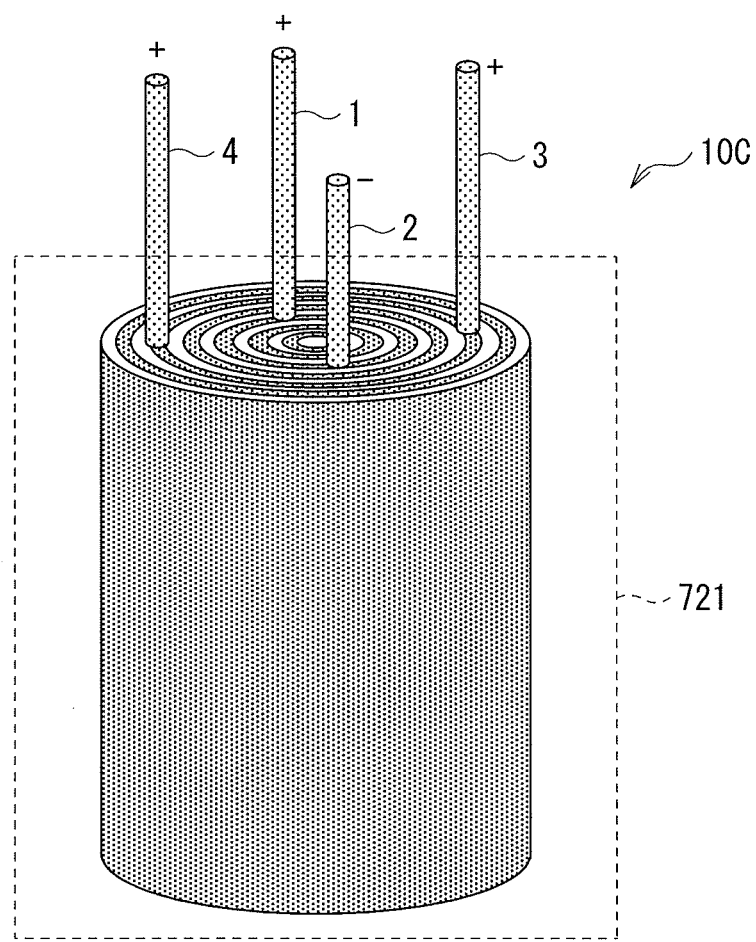
FIG. 47 is a perspective view of an example of an appearance of a main part of the capacitor illustrated in FIG. 46.

FIG. 46 illustrates a configuration of a main part of a capacitor 10C according to a first configuration example of the third example embodiment. FIG. 47 illustrates an example of an appearance of a main part of the capacitor 10C.

The capacitor 10C may include the first electrode 11, the second electrode 12, the first terminal conductor 1, the second terminal conductor 2, the third terminal conductor 3, and the fourth terminal conductor 4. These terminal conductors have substantially similar functions to those of the terminal conductors of the capacitor 10 illustrated in the above-mentioned FIGS. 9 to 12.

The first electrode 11 may be coupled to, for example, the DC power supply layer Vcc via the first terminal conductor 1. The second electrode 12 may be coupled to, for example, the ground layer GND via the second terminal conductor 2.

One end of the third terminal conductor 3 may be coupled to the first electrode 11 at a coupling position different from that of the first terminal conductor 1, and the other end thereof may be led out to the outside (i.e., out of the package 721). One end of the fourth terminal conductor 4 may be coupled to the first electrode 11 at a coupling position different from those of the first terminal conductor 1 and the third terminal conductor 3, and the other end thereof may be led out to the outside (i.e., out of the package 721).

As illustrated in a coupling described later (e.g., in FIG. 51), the third terminal conductor 3 may be coupled to the first coupling conductor 41 formed on the mounting substrate, for example. Likewise, as illustrated in the coupling described later (e.g., in FIG. 51), the fourth terminal conductor 4 may be coupled to the first coupling conductor 41 formed on the mounting substrate, for example. This allows two capacitors 10C (e.g., adjacent capacitors 10C-1 and 10C-2) to be coupled together via the first coupling conductor 41, as illustrated in the coupling described later (e.g., in FIG. 51).

Second Configuration Example

Figure 48:
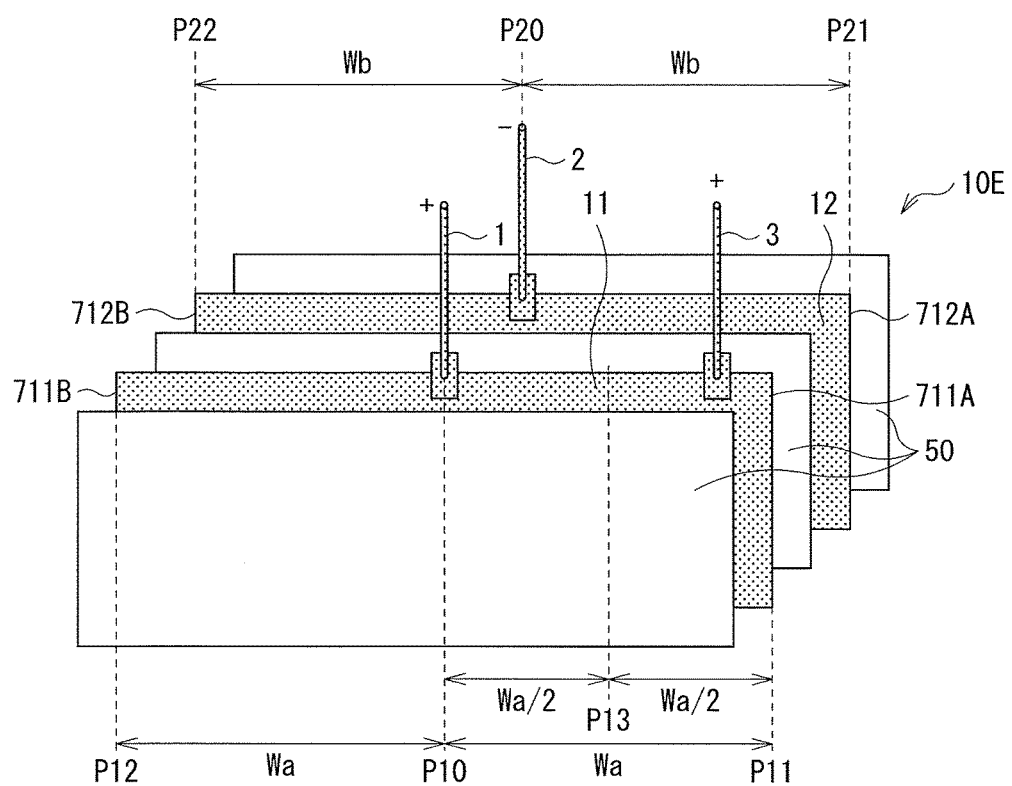
FIG. 48 is a main part configuration diagram illustrating a second configuration example of the capacitor according to the third example embodiment.

FIG. 48 illustrates a configuration of a main part of a capacitor 10E according to a second configuration example of the capacitor according to the third example embodiment.

The capacitor 10E may have a configuration in which the fourth terminal conductor 4 is eliminated from the capacitor 10C according to the first configuration example illustrated in FIG. 46.

Third Configuration Example

Figure 49:
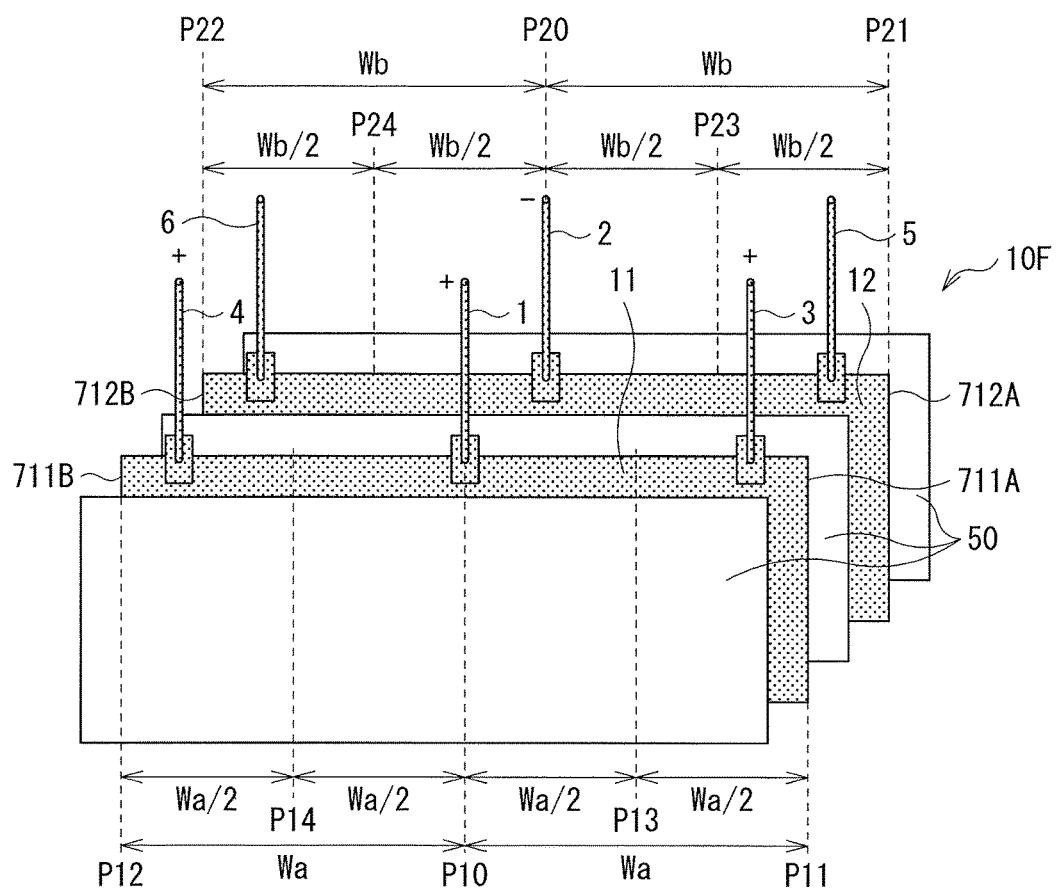
FIG. 49 is a main part configuration diagram illustrating a third configuration example of the capacitor according to the third example embodiment.

FIG. 49 illustrates a configuration of a main part of a capacitor 10F according to a third configuration example of the capacitor according to the third example embodiment.

The capacitor 10F may be configured to further include the fifth terminal conductor 5 and the sixth terminal conductor 6, in addition to the capacitor 10C according to the first configuration example illustrated in FIG. 46.

One end of the fifth terminal conductor 5 may be coupled to the second electrode 12 at a coupling position different from that of the second terminal conductor 2, and the other end thereof may be led out to the outside (i.e., out of the package 721). One end of the sixth terminal conductor 6 may be coupled to the second electrode 12 at a coupling position different from those of the second terminal conductor 2 and the fifth terminal conductor 5, and the other end thereof may be led out to the outside (i.e., out of the package 721).

As illustrated in a coupling described later (e.g., in FIG. 55), the fifth terminal conductor 5 may be coupled to the second coupling conductor 42 formed on the mounting substrate, for example. As illustrated in the coupling described later (e.g., in FIG. 55), the sixth terminal conductor 6 may be coupled to the second coupling conductor 42 formed on the mounting substrate, for example. This allows two capacitors 10F (e.g., adjacent capacitors 10E-1 and 10E-2) to be coupled together via the second coupling conductor 42, as illustrated in the coupling described later (e.g., in FIG. 55).

[Coupling Position of Terminal Conductor and Electrode of Each Configuration Example of Third Example Embodiment]

In each of the above-described configuration examples of the third example embodiment, the first electrode 11 may include a first end part 711A and a second end part 711B that are positioned opposite to each other in a longitudinal direction. The second electrode 12 may include a first end part 712A and a second end part 712B that are positioned opposite to each other in a longitudinal direction.

In a case of the electrolytic capacitor, typically, the first end part 711A and the second end part 711B of the first electrode 11 in the longitudinal direction may serve as an open end. Further, the first end part 712A and the second end part 712B of the second electrode 12 in the longitudinal direction may serve as an open end.

As illustrated in FIGS. 46, 48, and 49, in the longitudinal direction, a midpoint of the first electrode 11 is defined as P10, a position of the first end part 711A thereof as P11, and a position of the second end part 711B thereof as P12. A length from the midpoint P10 of the first electrode 11 to the position P11 of the first end part 711A thereof (or to the position P12 of the second end part 711B thereof) is defined as Wa.

Further, in the longitudinal direction, a midpoint of the second electrode 12 is defined as P20, a position of the first end part 712A thereof as P21, and a position of the second end part 712B thereof as P22. A length from the midpoint P20 of the second electrode 12 to the position P21 of the first end part 712A thereof (or to the position P22 of the second end part 712B thereof) is defined as Wb.

In each of the above-described configuration examples, one end of the first terminal conductor 1 may be coupled to the midpoint P10 of the first electrode 11 in the longitudinal direction, in one embodiment.

In each of the above-described configuration examples, one end of the second terminal conductor 2 may be coupled to the midpoint P20 of the second electrode 12 in the longitudinal direction, in one embodiment.

In each of the above-described configuration examples, one end of the third terminal conductor 3 may be coupled to the first electrode 11 at a location between the coupling position (the midpoint P10) of the first terminal conductor 1 in the first electrode 11 and the position P11 of the first end part 711A of the first electrode 11. In one embodiment, one end of the third terminal conductor 3 may be coupled to the first electrode 11 at a position closer to the first end part 711A of the first electrode 11 than an intermediate position P13 between the coupling position of the first terminal conductor 1 in the first electrode 11 and the first end part 711A. This increases an antiresonance-attenuating effect described later.

As illustrated in FIGS. 48 and 49, one end of the fourth terminal conductor 4 may be coupled to the first electrode 11 at a location between the coupling position of the first terminal conductor 1 in the first electrode 11 and the second end part 711B of the first electrode 11. In one embodiment, one end of the fourth terminal conductor 4 may be coupled to the first electrode 11 at a position closer to the second end part 711B of the first electrode 11 than an intermediate position P14 between the coupling position of the first terminal conductor 1 in the first electrode 11 and the second end part 711B. This increases the antiresonance-attenuating effect described later. Further, in one embodiment, the third terminal conductor 3 and the fourth terminal conductor 4 may be disposed at symmetrical positions with respect to the coupling position of the first terminal conductor 1 in the longitudinal direction of the first electrode 11. This makes it possible to suppress occurrence of unnecessary resonance.

As illustrated in FIG. 49, one end of the fifth terminal conductor 5 may be coupled to the second electrode 12 at a location between the coupling position (the midpoint P20) of the second terminal conductor 2 in the second electrode 12 and the first end part 712A of the second electrode 12. In one embodiment, one end of the fifth terminal conductor 5 may be coupled to the second electrode 12 at a position closer to the first end part 712A of the second electrode 12 than an intermediate position P23 between the coupling position of the second terminal conductor 2 in the second electrode 12 and the first end part 712A. This increases the antiresonance-attenuating effect described later.

As illustrated in FIG. 49, one end of the sixth terminal conductor 6 may be coupled to the second electrode 12 at a location between the coupling position of the second terminal conductor 2 in the second electrode 12 and the second end part 712B of the second electrode 12. In one embodiment, one end of the sixth terminal conductor 6 may be coupled to the second electrode 12 at a position closer to the second end part 712B of the second electrode 12 than an intermediate position P24 between the coupling position of the second terminal conductor 2 in the second electrode 12 and the second end part 712B. This increases the antiresonance-attenuating effect described later. Further, in one embodiment, the fifth terminal conductor 5 and the sixth terminal conductor 6 may be disposed at symmetrical positions with respect to the coupling position of the second terminal conductor 2 in the longitudinal direction of the second electrode 12. This makes it possible to suppress occurrence of unnecessary resonance.

[Electrical Characteristics of Electrolytic Capacitors Disposed in Parallel]

Figure 50:
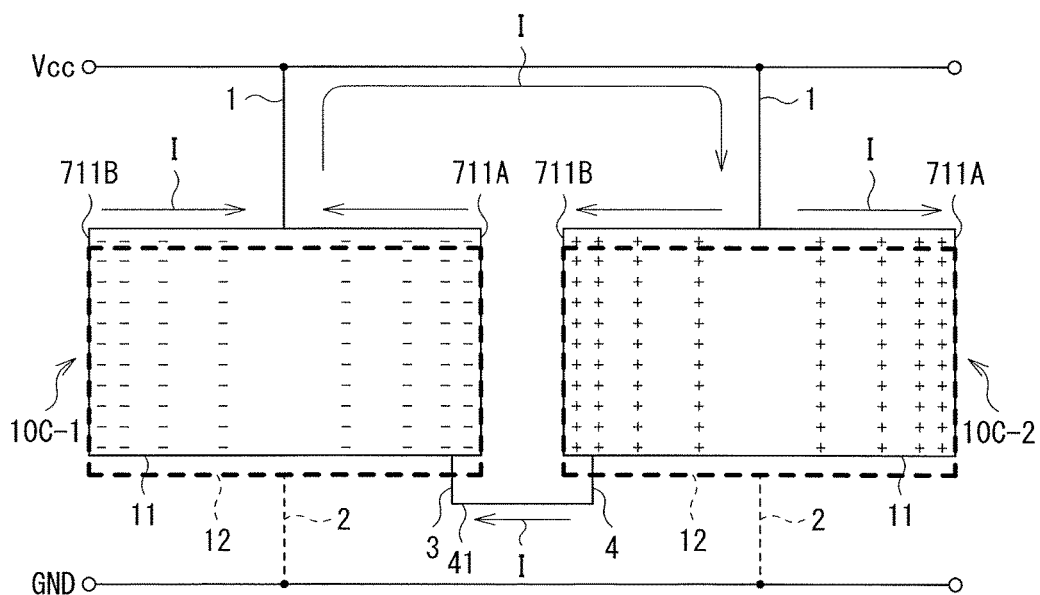
FIG. 50 describes a state of a current I that flows upon antiresonance of two electrolytic capacitors disposed in parallel.

FIG. 50 illustrates a state of the current I that flows upon antiresonance of two electrolytic capacitors disposed in parallel. It is to be noted that, although FIG. 50 gives an illustration by exemplifying electrical characteristics in the first electrode 11, the same holds true also for the second electrode 12. FIG. 50 exemplifies a case where the two capacitors 10C (i.e., the capacitors 10C-1 and 10C-2) according to the first configuration example (in FIG. 46) are disposed in parallel. In FIG. 50, the third terminal conductor 3 of the capacitor 10C-1 and the fourth terminal conductor 4 of the capacitor 10C-2 may be intercoupled together via the first coupling conductor 41.

FIG. 50 illustrates the current I that flows upon the antiresonance. It is to be noted that the current I that flows upon the antiresonance is an alternating current and that an orientation of the flowing current I may be possibly opposite to the orientations illustrated in FIG. 50. FIG. 50 exemplifies a case where the current I flows at a moment when the first electrode 11 of the capacitor 10C-1 is turned into minus (−) and the second electrode 12 of the capacitor 10C-1 is turned into plus (+) and when the first electrode 11 of the capacitor 10C-2 is turned into plus (+) and the second electrode 12 of the capacitor 10C-2 is turned into minus (−).

Upon the antiresonance, for example, the current I flows from the capacitor 10C-1 to the capacitor 10C-2 via the first terminal conductor 1 of the capacitor 10C-1, the DC power supply layer Vcc, and the first terminal conductor 1 of the capacitor 10C-2.

Further, at the moment illustrated in FIG. 50, the current I flows, in the longitudinal direction, from both ends (i.e., the first end part 711A and the second end part 711B) of the first electrode 11 to the coupling position of the first terminal conductor 1, in the capacitor 10C-1; the closer location of electric charges becomes to both the ends of the first electrode 11 in the longitudinal direction, the more the electric charges may be distributed. Accordingly, for example, the capacitor 10C-1 that is one of the two capacitors 10C may have the lowest potential at both the ends of the first electrode 11 in the longitudinal direction.

The capacitor 10C-2 that is the other of the two capacitors 10C may have the highest potential at both ends of the first electrode 11 in the longitudinal direction at the moment illustrated in FIG. 50, when the current I flows, in the longitudinal direction, toward both the ends of the first electrode 11 from the coupling position of the first terminal conductor 1.

In this situation, one end of the third terminal conductor 3 may be coupled to the first electrode 11 at a position closer to the first end part 711A of the first electrode 11 in the longitudinal direction. Further, one end of the fourth terminal conductor 4 may be coupled to the first electrode 11 at a position closer to the second end part 711B of the first electrode 11 in the longitudinal direction. Furthermore, the other end of the third terminal conductor 3 of the capacitor 10C-1 that is one of the two capacitors 10C and the other end of the fourth terminal conductor 4 of the capacitor 10C-2 that is the other of the two capacitors 10C may be intercoupled together via the first coupling conductor 41. In this case, there is a large potential difference between the third terminal conductor 3 of the capacitor 10C-1 that is one of the two capacitors 10C and the fourth terminal conductor 4 of the capacitor 10C-2 that is the other of the two capacitors 10C, upon the antiresonance. Thus, the first coupling conductor 41 serves as a resistance. Thus, the current I flows through the fourth terminal conductor 4 of the capacitor 10C-2, the first coupling conductor 41, and the third terminal conductor 3 of the capacitor 10C-1. This allows energy of the antiresonance to be absorbed as Joule heat and thus to be attenuated. This makes it possible to attenuate the antiresonance without substantially varying the equivalent series resistance or equivalent series inductance which the capacitors 10C-1 and 10C-2 originally have.

As illustrated in a coupling described later (in FIG. 54), two capacitors 10E (e.g., adjacent capacitors 10E-1 and 10E-2) according to the second configuration example (in FIG. 48) that eliminates the fourth terminal conductor 4 may be coupled together via the first coupling conductor 41. Even in such a case, it is possible to attenuate the antiresonance in the first electrode 11 in accordance with a principle similar to that described above. That is, upon the antiresonance, there is a large potential difference between the third terminal conductor 3 of the capacitor 10E-1 that is one of the two capacitors 10E and the third terminal conductor 3 of the capacitor 10E-2 that is the other of the two capacitors 10E. Thus, the first coupling conductor 41 serves as a resistance. Thus, the current I flows through the third terminal conductor 3 of the capacitor 10E-2, the first coupling conductor 41, and the third terminal conductor 3 of the capacitor 10E-1. This allows energy of the antiresonance to be absorbed as Joule heat and thus to be attenuated. This makes it possible to attenuate the antiresonance without substantially varying the equivalent series resistance or equivalent series inductance which the capacitors 10E-1 and 10E-2 originally have.

Further, as illustrated in a coupling described later (e.g., in FIG. 55), the two capacitors 10F (e.g., the adjacent capacitors 10E-1 and 10E-2) according to the third configuration example (in FIG. 49) that each include the fifth terminal conductor 5 and the sixth terminal conductor 6 may be coupled together via the second coupling conductor 42. In such a case, it is possible to attenuate the antiresonance in the second electrode 12 in accordance with a principle similar to that described above. That is, upon the antiresonance, there is a large potential difference between the fifth terminal conductor 5 of the capacitor 10E-1 that is one of the two capacitors 10F and the sixth terminal conductor 6 of the capacitor 10E-2 that is the other of the two capacitors 10F. Thus, the second coupling conductor 42 serves as a resistance. Thus, the current I flows through the sixth terminal conductor 6 of the capacitor 10E-2, the second coupling conductor 42, and the fifth terminal conductor 5 of the capacitor 10E-1. This allows energy of the antiresonance to be absorbed as Joule heat and thus to be attenuated. This makes it possible to attenuate the antiresonance without substantially varying the equivalent series resistance or equivalent series inductance which the capacitors 10E-1 and 10E-2 originally have.

[Example of Coupling]
[First Coupling]

Figure 51:
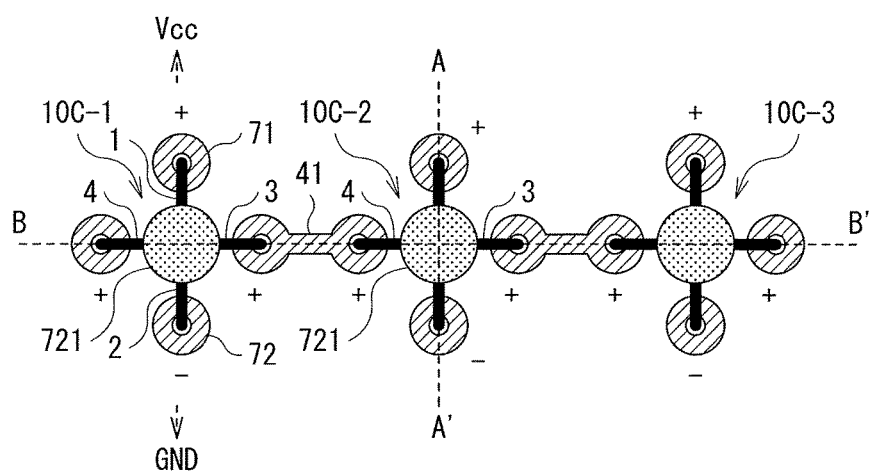
FIG. 51 is a plan view of a coupling in a case where capacitors according to the first configuration example illustrated in FIG. 46 are disposed in parallel.
Figure 52:
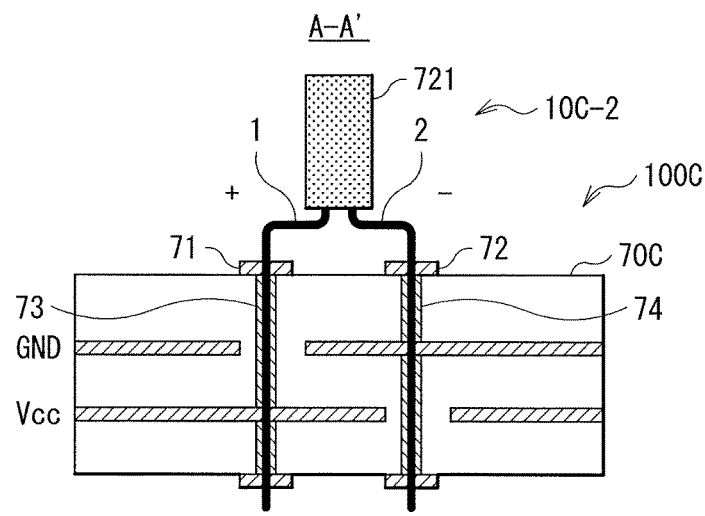
FIG. 52 is a cross-sectional view of an example of a cross-sectional configuration taken along a line A-A' in FIG. 51.
Figure 53:
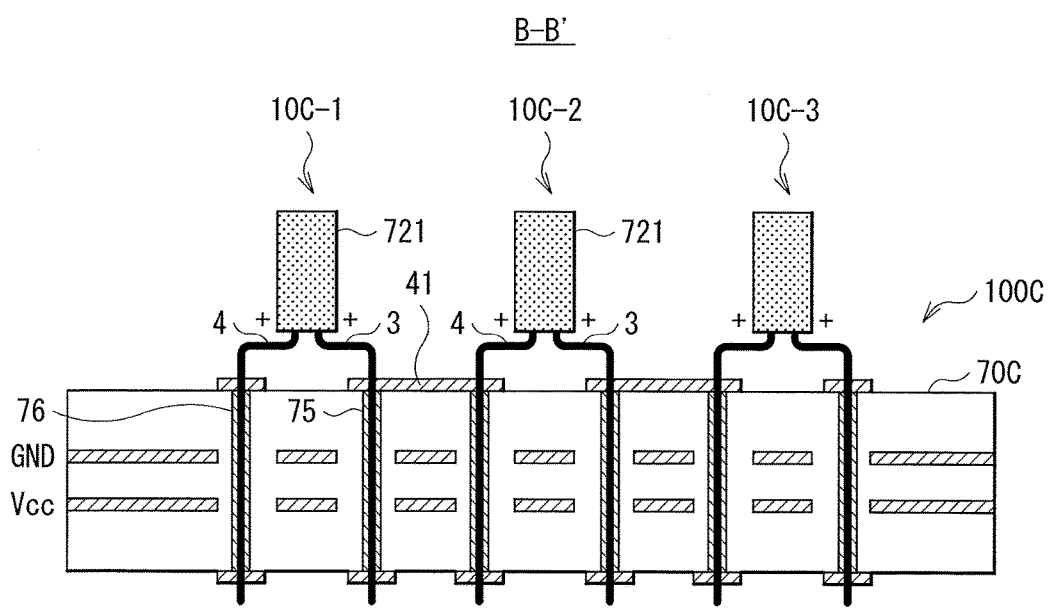
FIG. 53 is a cross-sectional view of an example of a cross-sectional configuration taken along a line B-B' in FIG. 51.

FIG. 51 illustrates a coupling in a case where capacitors 10C according to the first configuration example illustrated in FIG. 46 are disposed in parallel. FIG. 52 illustrates an example of a cross-sectional configuration taken along a line A-A' in FIG. 51. FIG. 53 illustrates an example of a cross-sectional configuration taken along a line B-B' in FIG. 51.

The first to fourth terminal conductors 1 to 4 may be disposed in a substantially cross shape at one end of a capacitor main body. The first terminal conductor 1 and the second terminal conductor 2 may be arranged in a row in a first direction. Further, the third terminal conductor 3 and the fourth terminal conductor 4 may be arranged in a row in a second direction that is substantially orthogonal to the first direction.

As illustrated in FIGS. 52 and 53, a substrate module 100C in the first coupling includes the first coupling conductor 41 and a mounting substrate 70C. The first coupling conductor 41 couples two capacitors 10C of the capacitors 10C together. The mounting substrate 70C may include the DC power supply layer Vcc and the ground layer GND. It is to be noted that, although FIG. 51 illustrates an example of three capacitors 10C (i.e., 10C-1, 10C-2, and 10C-3), the number of the capacitor 10C may be less than or more than three.

The first coupling conductor 41 may be a conductor pattern formed on a surface of the mounting substrate 70C, for example.

As illustrated in FIGS. 52 and 53, the mounting substrate 70C may include the wiring line 71, the wiring line 72, the wiring line 73, the wiring line 74, a wiring line 75, and a wiring line 76. The wiring line 71 and the wiring line 72 may be each a conductor pattern formed on the surface of the mounting substrate 70C, for example. The wiring line 73, the wiring line 74, the wiring line 75, and the wiring line 76 may be each, for example, a metalized through-hole that penetrates from the surface to a rear surface of the mounting substrate 70C.

Each first terminal conductor 1 of the capacitors 10C may be coupled to the DC power supply layer Vcc via the wiring line 71 and the wiring line 73.

Each second terminal conductor 2 of the capacitors 10C may be coupled to the ground layer GND via the wiring line 72 and the wiring line 74.

Each third terminal conductor 3 of the capacitors 10C may be coupled to the wiring line 75 and to the first coupling conductor 41.

Each fourth terminal conductor 4 of the capacitors 10C may be coupled to the wiring line 76 and to the first coupling conductor 41.

In the coupling, the capacitors 10C may be disposed to allow all of the respective third terminal conductors 3 and the respective fourth terminal conductors 4 to be arranged in the same direction, i.e., to be arranged laterally.

In the coupling, the third terminal conductor 3 of the first capacitor (e.g., the capacitor 10C-1) of the two capacitors 10C (e.g., the adjacent capacitors 10C-1 and 10C-2) and the fourth terminal conductor 4 of the second capacitor (e.g., the capacitor 10C-2) of the two capacitors 10C (e.g., the adjacent capacitors 10C-1 and 10C-2) may be intercoupled together via the first coupling conductor 41. This allows the capacitors 10C to be cascaded.

Intercoupling the third terminal conductor 3 and the fourth terminal conductor 4 in the two capacitors 10C via the first coupling conductor 41 in this manner makes it possible to mount the capacitors 10C in the smaller mounting area. Further, only the small pattern area of the first coupling conductor 41 suffices.

[Second Coupling]

Figure 54:
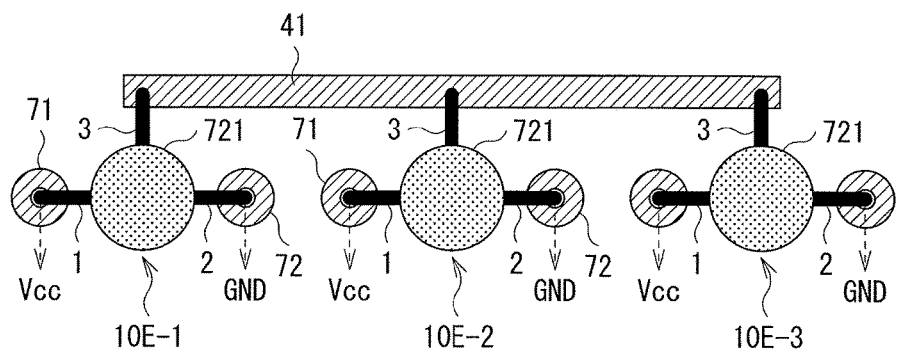
FIG. 54 is a plan view of a coupling in a case where capacitors according to the second configuration example illustrated in FIG. 48 are disposed in parallel.

FIG. 54 illustrates a coupling in a case where capacitors 10E according to the second configuration example illustrated in FIG. 48 are disposed in parallel.

In the second coupling, the third terminal conductor 3 may be disposed to be oriented in a first direction. Further, the first terminal conductor 1 and the second terminal conductor 2 may be arranged in a second direction that is substantially orthogonal to the first direction.

Similarly to the substrate module 100C in the first coupling, the substrate module according to the second coupling includes the first coupling conductor 41 and the mounting substrate. The first coupling conductor 41 couples two capacitors 10E of the capacitors 10E together. The mounting substrate may include the DC power supply layer Vcc and the ground layer GND. It is to be noted that, although FIG. 54 illustrates an example of three capacitors 10E (i.e., 10E-1, 10E-2, and 10E-3), the number of the capacitor 10E may be less than or more than three.

In the second coupling, the third terminal conductor 3 of the first capacitor (e.g., the capacitor 10E-1) of the two capacitors 10E (e.g., the adjacent capacitors 10E-1 and 10E-2) and the third terminal conductor 3 of the second capacitor (e.g., the capacitor 10E-2) of the two capacitors 10E (e.g., the adjacent capacitors 10E-1 and 10E-2) may be intercoupled together via the first coupling conductor 41. This allows the capacitors 10E to be cascaded.

[Third Coupling]

Figure 55:
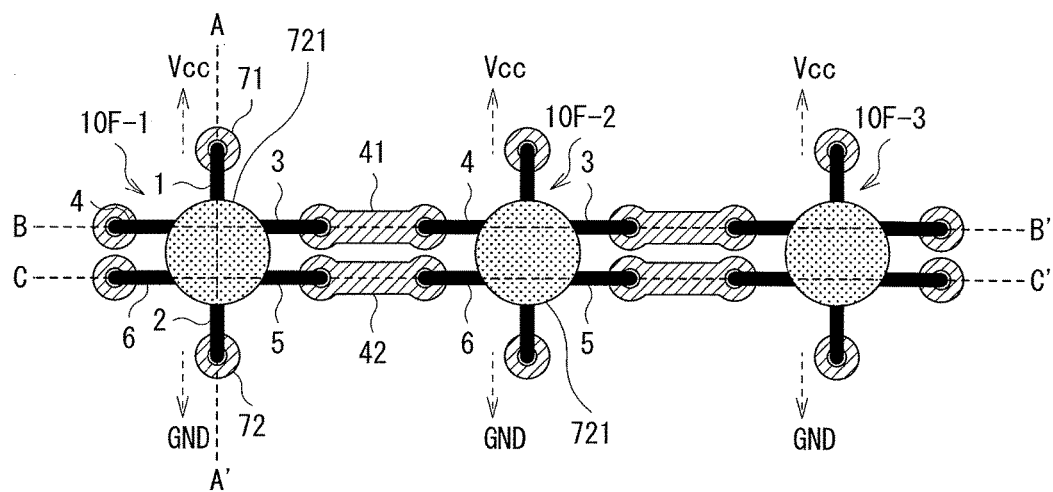
FIG. 55 is a plan view of a coupling in a case where capacitors according to the third configuration example illustrated in FIG. 49 are disposed in parallel.
Figure 56:
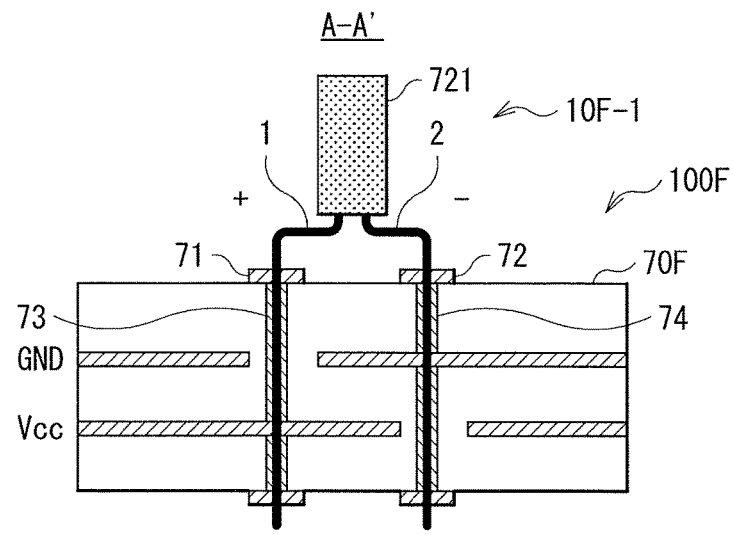
FIG. 56 is a cross-sectional view of an example of a cross-sectional configuration taken along a line A-A' in FIG. 55.
Figure 57:
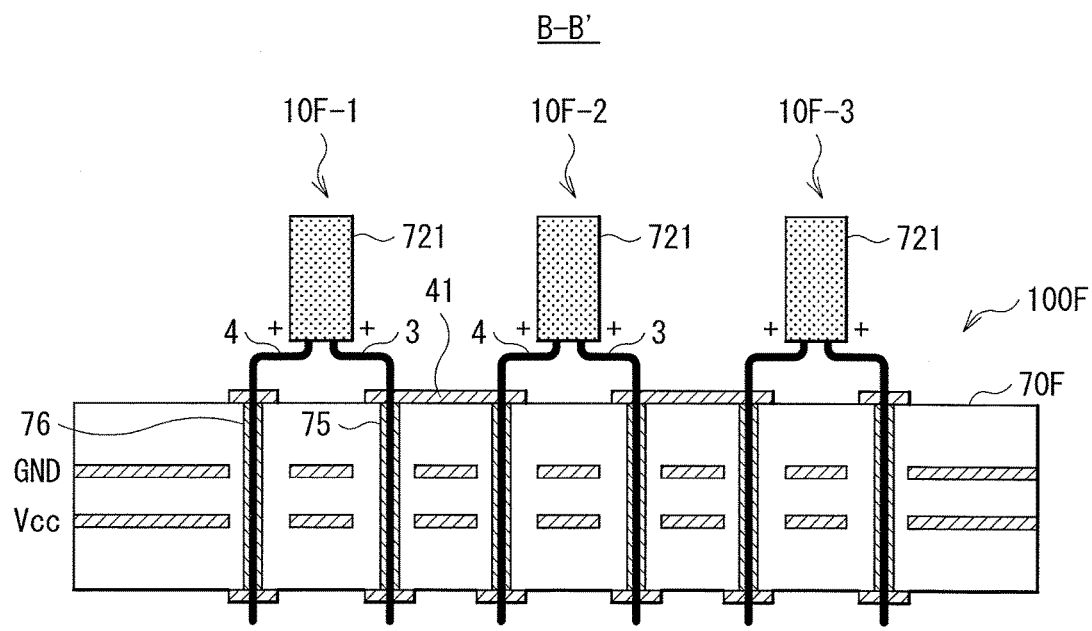
FIG. 57 is a cross-sectional view of an example of a cross-sectional configuration taken along a line B-B' in FIG. 55.
Figure 58:
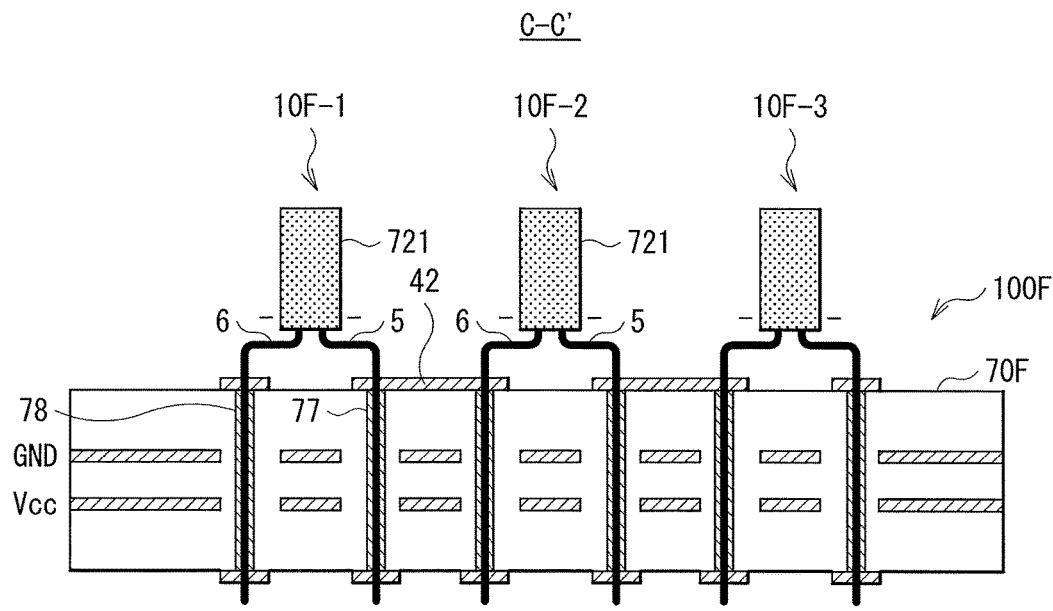
FIG. 58 is a cross-sectional view of an example of a cross-sectional configuration taken along a line C-C' in FIG. 55.

FIG. 55 illustrates a coupling in a case where capacitors 10F according to the third configuration example illustrated in FIG. 49 are disposed in parallel. FIG. 56 illustrates an example of a cross-sectional configuration taken along a line A-A' in FIG. 55. FIG. 57 illustrates an example of a cross-sectional configuration taken along a line B-B' in FIG. 55. FIG. 58 illustrates an example of a cross-sectional configuration taken along a line C-C' in FIG. 55.

In the third coupling, the first terminal conductor 1 and the second terminal conductor 2 may be arranged in a row in a first direction. Further, the third terminal conductor 3 and the fourth terminal conductor 4 may be arranged in a second direction that is substantially orthogonal to the first direction. Likewise, the fifth terminal conductor 5 and the sixth terminal conductor 6 may be arranged in the second direction that is substantially orthogonal to the first direction.

As illustrated in FIGS. 56 to 58, a substrate module 100F according to the third coupling may include the first coupling conductor 41, the second coupling conductor 42, and a mounting substrate 70F. The first coupling conductor 41 and the second coupling conductor 42 may each couple the two capacitors 10F of the capacitors 10F together. The mounting substrate 70F may include the DC power supply layer Vcc and the ground layer GND. It is to be noted that, although FIG. 55 illustrates an example of three capacitors 10F (i.e., 10E-1, 10E-2, and 10E-3), the number of the capacitor 10F may be less than or more than three.

The first coupling conductor 41 and the second coupling conductor 42 may be each a conductor pattern formed on a surface of the mounting substrate 70F, for example.

As illustrated in FIGS. 56 to 58, the mounting substrate 70F may include the wiring line 71, the wiring line 72, the wiring line 73, the wiring line 74, the wiring line 75, the wiring line 76, a wiring line 77, and a wiring line 78. The wiring line 71 and the wiring line 72 may be each a conductor pattern formed on the surface of the mounting substrate 70F, for example. The wiring line 73, the wiring line 74, the wiring line 75, the wiring line 76, the wiring line 77, and the wiring line 78 may be each, for example, a metalized through-hole that penetrates from the surface to a rear surface of the mounting substrate 70F.

Each first terminal conductor 1 of the capacitors 10F may be coupled to the DC power supply layer Vcc via the wiring line 71 and the wiring line 73.

Each second terminal conductor 2 of the capacitors 10F may be coupled to the ground layer GND via the wiring line 72 and the wiring line 74.

Each third terminal conductor 3 of the capacitors 10F may be coupled to the wiring line 75 and to the first coupling conductor 41.

Each fourth terminal conductor 4 of the capacitors 10F may be coupled to the wiring line 76 and to the first coupling conductor 41.

Each fifth terminal conductor 5 of the capacitors 10F may be coupled to the wiring line 77 and to the second coupling conductor 42.

Each sixth terminal conductor 6 of the capacitors 10F may be coupled to the wiring line 78 and to the second coupling conductor 42.

In the third coupling, the capacitors 10F may be disposed to allow all of the respective third terminal conductors 3 and the respective fourth terminal conductors 4 to be arranged in the same direction, i.e., to be arranged laterally.

Further, in the third coupling, the capacitors 10F may be disposed to allow all of the respective fifth terminal conductors 5 and the respective sixth terminal conductors 6 to be arranged in the same direction, i.e., to be arranged laterally.

In the third coupling, the third terminal conductor 3 of the first capacitor (e.g., the capacitor 10E-1) of the two capacitors 10F (e.g., the adjacent capacitors 10E-1 and 10E-2) and the fourth terminal conductor 4 of the second capacitor (e.g., the capacitor 10E-2) of the two capacitors 10F (e.g., the adjacent capacitors 10E-1 and 10E-2) may be intercoupled together via the first coupling conductor 41. This allows the capacitors 10F to be cascaded.

Further, in the third coupling, the fifth terminal conductor 5 of the first capacitor (e.g., the capacitor 10E-1) of the two capacitors 10F (e.g., the adjacent capacitors 10E-1 and 10E-2) and the sixth terminal conductor 6 of the second capacitor (e.g., the capacitor 10E-2) of the two capacitors 10F (e.g., the adjacent capacitors 10E-1 and 10E-2) may be intercoupled together via the second coupling conductor 42. This allows the capacitors 10F to be cascaded.

Intercoupling the third terminal conductor 3 and the fourth terminal conductor 4 in the two capacitors 10F via the first coupling conductor 41 and intercoupling the fifth terminal conductor 5 and the sixth terminal conductor 6 in the two capacitors 10F via the second coupling conductor 42 in this manner make it possible to attenuate the antiresonance more than a case where the coupling is performed only via the first coupling conductor 41.

Other configurations, operations, and effects are substantially similar to those of the capacitor and the substrate module according to the foregoing first or second example embodiment.

Modification Example of Third Example Embodiment

Figure 59:
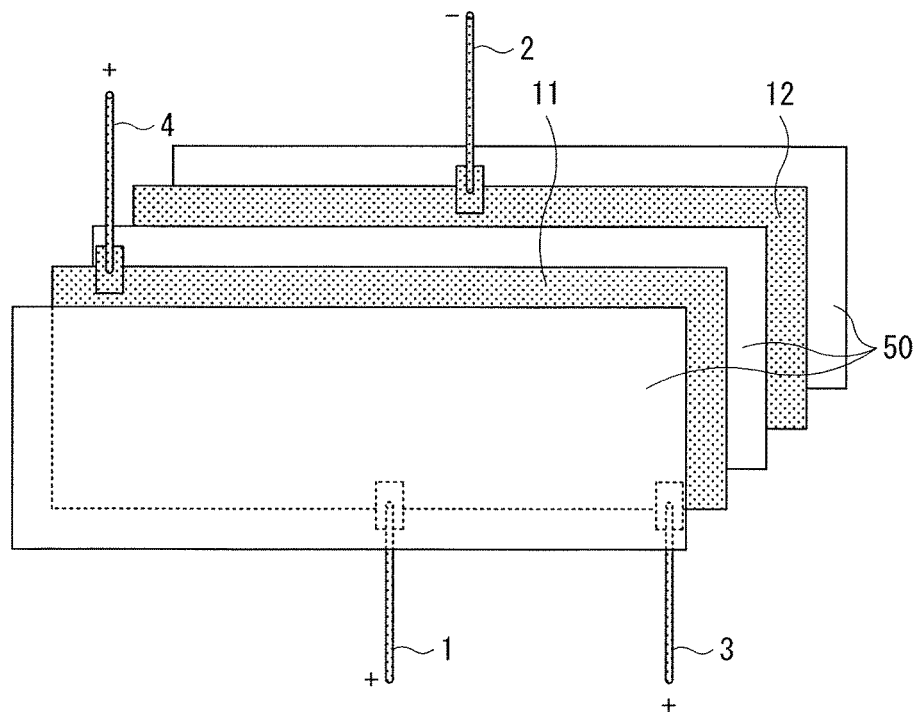
FIG. 59 is a configuration diagram illustrating a configuration example of the first electrode and the second electrode in a capacitor according to a modification example of the third example embodiment.
Figure 60:
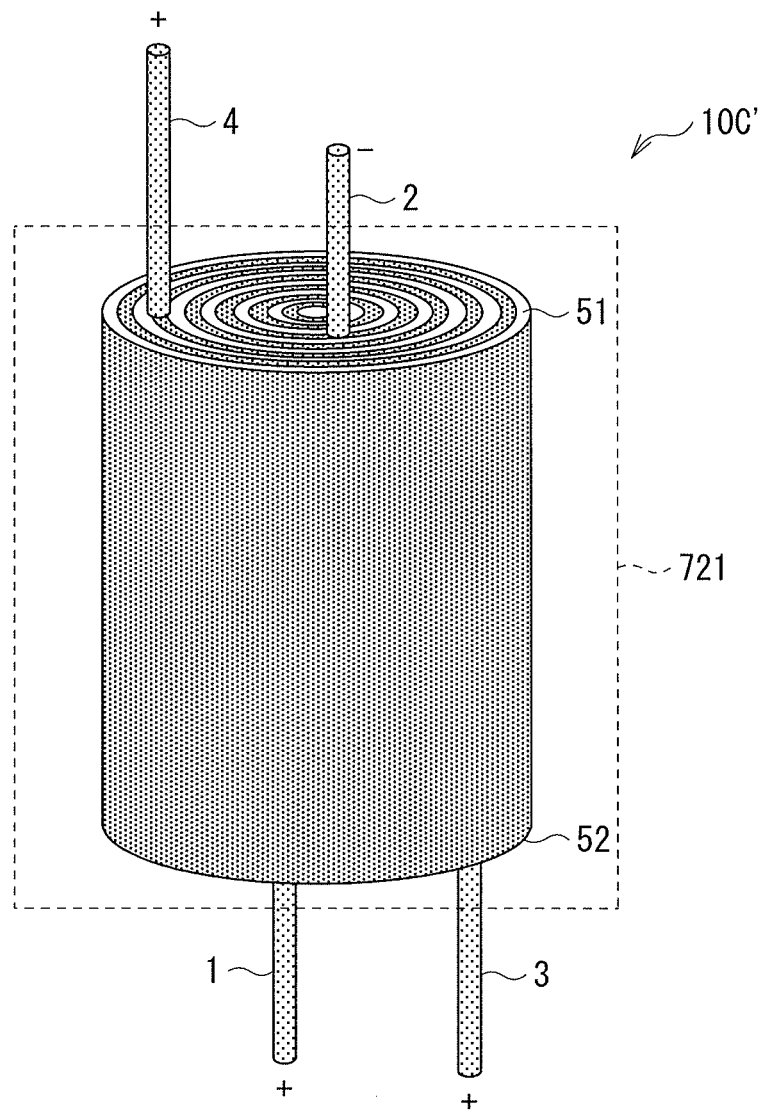
FIG. 60 is a perspective view of an example of an appearance of the capacitor according to the modification example of the third example embodiment.

FIG. 59 illustrates a configuration example of the first electrode 11 and the second electrode 12 in a capacitor 10C' according to a modification example of the third example embodiment. FIG. 60 illustrates an example of an appearance of the capacitor 10C'.

Figure 44:
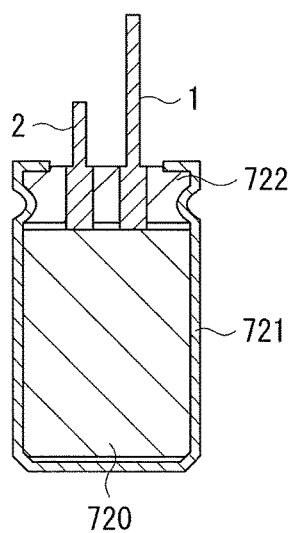
FIG. 44 is a cross-sectional view of a configuration example of an electrolytic capacitor according to a comparative example.

The capacitor 10C' according to the present modification example differs from the capacitor 10C illustrated in FIGS. 44 and 47 in the coupling positions of the first terminal conductor 1 and the third terminal conductor 3 in the first electrode 11 and in led-out directions thereof. In the first electrode 11, the coupling positions of the first terminal conductor 1 and the third terminal conductor 3 and the led-out directions thereof may be opposite, respectively, to the coupling position of the fourth terminal conductor 4 and led-out direction of the fourth terminal conductor 4.

As illustrated in FIG. 60, one end of a wound body of the first electrode 11, the separator 50, and the second electrode 12 is defined as a first end 51, and the other end positioned opposite to one end is defined as a second end 52.

In the capacitor 10C illustrated in FIG. 47, all respective one ends of the first terminal conductor 1, the second terminal conductor 2, the third terminal conductor 3, and the fourth terminal conductor 4 may be coupled to side of the first end 51, and all respective the other ends thereof may be led out to the outside from the side of the first end 51. In contrast, in the capacitor 10C' according to the present modification example, respective one ends of the first terminal conductor 1 and the third terminal conductor 3 may be coupled to side of the second end 52, and respective the other ends of the first terminal conductor 1 and the third terminal conductor 3 may be led out to the outside from the side of the second end 52.

As illustrated in FIGS. 59 and 60, one end of the first terminal conductor 1 and one end of the second terminal conductor 2 may be coupled to ends that are opposite to each other, and the other end of the first terminal conductor 1 and the other end of the second terminal conductor 2 may be led out to the outside from the ends that are opposite to each other. Further, one end of the third terminal conductor 3 and one end of the fourth terminal conductor 4 may be coupled to ends that are opposite to each other, and the other end of the third terminal conductor 3 and the other end of the fourth terminal conductor 4 may be led out to the outside from the ends that are opposite to each other. Furthermore, one end of the first terminal conductor 1 and one end of the fourth terminal conductor 4 may be coupled to ends that are opposite to each other, and the other end of the first terminal conductor 1 and the other end of the fourth terminal conductor 4 may be led out to the outside from the ends that are opposite to each other.

Further, for example, only one of one end of the first terminal conductor 1 and one end of the third terminal conductor 3 may be coupled to the side of the second end 52, and only one of the other end of the first terminal conductor 1 and the other end of the third terminal conductor 3 may be led out to the outside from the side of the second end 52, although illustration is not given. Thus, one end of the first terminal conductor 1 and one end of the third terminal conductor 3 may be coupled to ends that are opposite to each other, and the other end of the first terminal conductor 1 and the other end of the third terminal conductor 3 may be led out to the outside from the ends that are opposite to each other.

It is to be noted that a coupling in a case where capacitors 10' according to the present modification example are disposed in parallel may be substantially similar to that illustrated in FIG. 51, for example.

4. Fourth Example Embodiment

Description is given next of the capacitor and the substrate module according to a fourth example embodiment of the disclosure. It is to be noted that, in the following, parts that are substantially the same as the components of the capacitors and the substrate modules according to the foregoing first to third example embodiments are denoted with the same reference numerals, and descriptions thereof are omitted where appropriate.

Figure 61:
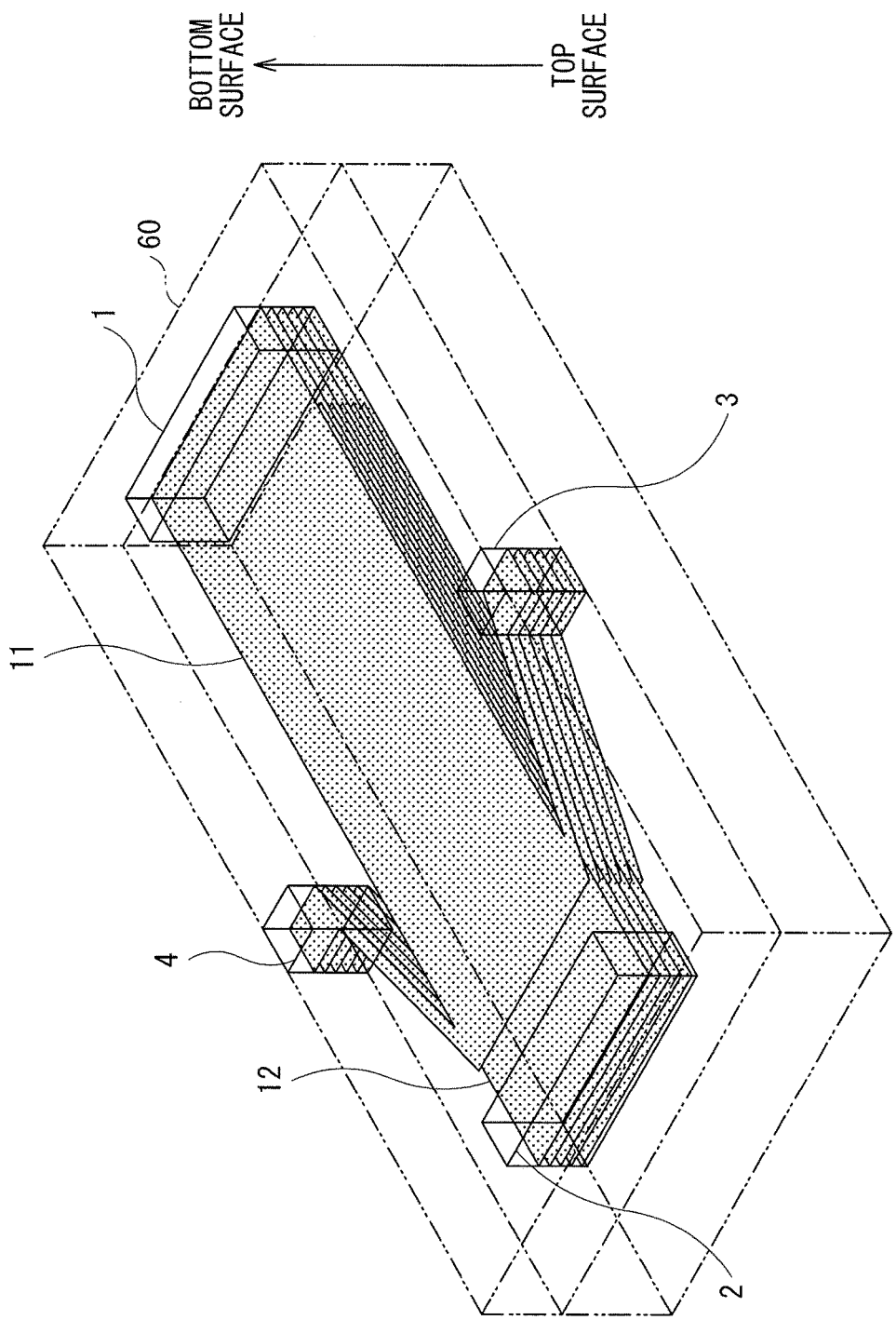
FIG. 61 is a perspective view of a configuration example of a capacitor according to a fourth example embodiment.

FIG. 61 illustrates a configuration example of a capacitor according to the fourth example embodiment of the disclosure.

For example, in the capacitor 10 according to the foregoing first example embodiment, the first terminal conductor 1, the second terminal conductor 2, the third terminal conductor 3, and the fourth terminal conductor 4 may be formed on surfaces of an outer form of the substantially cuboid shape; however, these terminal conductors each may be in the form of through-hole.

In the configuration example of FIG. 61, the first electrodes 11 and the second electrodes 12 are disposed alternately in a laminated manner inside a dielectric 60. The first to fourth terminal conductors 1 to 4 may be in electric conduction from the inside of the dielectric 60 to side of a bottom surface thereof in the form of through-hole. In the configuration example of FIG. 61, the bottom surface of the dielectric 60 may be disposed on a surface of the mounting substrate, whereby the first to fourth terminal conductors 1 to 4 may be coupled to the power supply layer or the coupling conductor, for example, on side of the mounting substrate.

A coupling, for example, in a case where capacitors illustrated in FIG. 61 are coupled may be substantially similar to that of the foregoing first example embodiment.

5. Fifth Example Embodiment

Description is given next of a coupling of capacitors according to a fifth example embodiment of the disclosure.

It is to be noted that, in the following, parts that are substantially the same as the components of the capacitors and the substrate modules according to the foregoing first to fourth example embodiments are denoted with the same reference numerals, and descriptions thereof are omitted where appropriate.

Figure 62:
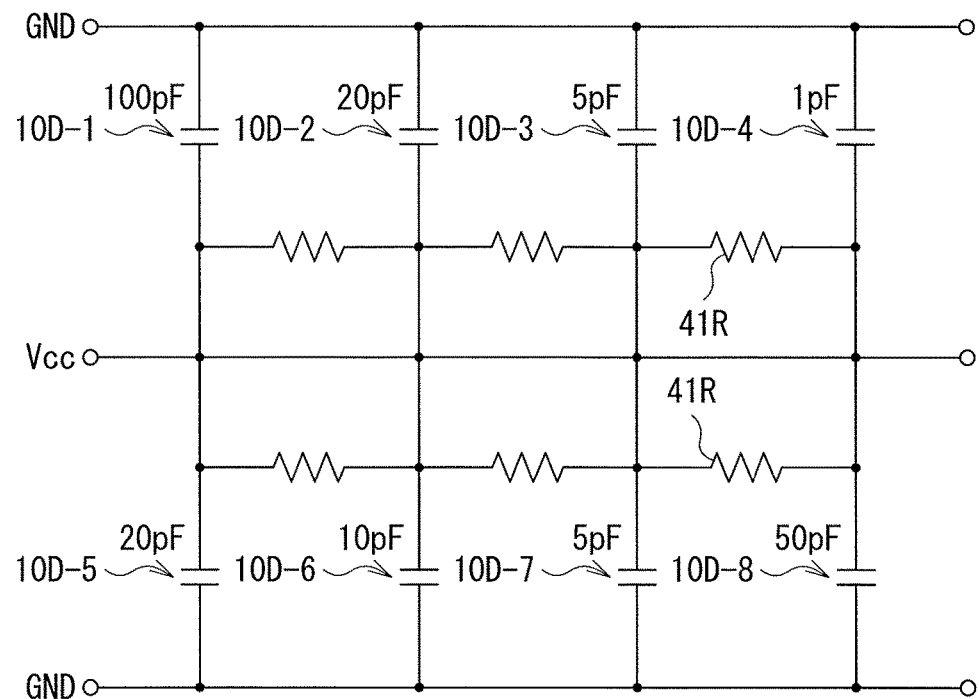
FIG. 62 is a circuit diagram illustrating an example of a coupling of capacitors according to a fifth example embodiment.

FIG. 62 illustrates an example of the coupling of the capacitors according to the fifth example embodiment.

In a circuit of FIG. 62, capacitors 10D-1, 10D-2, 10D-3, and 10D-4 may be cascaded by a coupling conductor (i.e., the resistance 41R), between the ground layer GND and the DC power supply layer Vcc. Further, capacitors 10D-5, 10D-6, 10D-7, and 10D-8 may be cascaded by the coupling conductor (i.e., the resistance 41R), between the ground layer GND and the DC power supply layer Vcc.

The capacitors 10D-1 to 10D-4 may have capacitance values that are different from one another. The capacitor 10D-1 may have a capacitance value of 100 pF. The capacitor 10D-2 may have a capacitance value of 20 pF. The capacitor 10D-3 may have a capacitance value of 5 pF. The capacitor 10D-4 may have a capacitance value of 1 pF. This allows the capacitors 10D-1 to 10D-4 to have self-resonant frequencies that are different from one another.

Further, the capacitors 10D-5 to 10D-8 may have capacitance values that are different from one another. The capacitor 10D-5 may have a capacitance value of 20 pF. The capacitor 10D-6 may have a capacitance value of 10 pF. The capacitor 10D-7 may have a capacitance value of 5 pF. The capacitor 10D-8 may have a capacitance value of 50 pF. This allows the capacitors 10D-5 to 10D-8 to have self-resonant frequencies that are different from one another.

Figure 63:
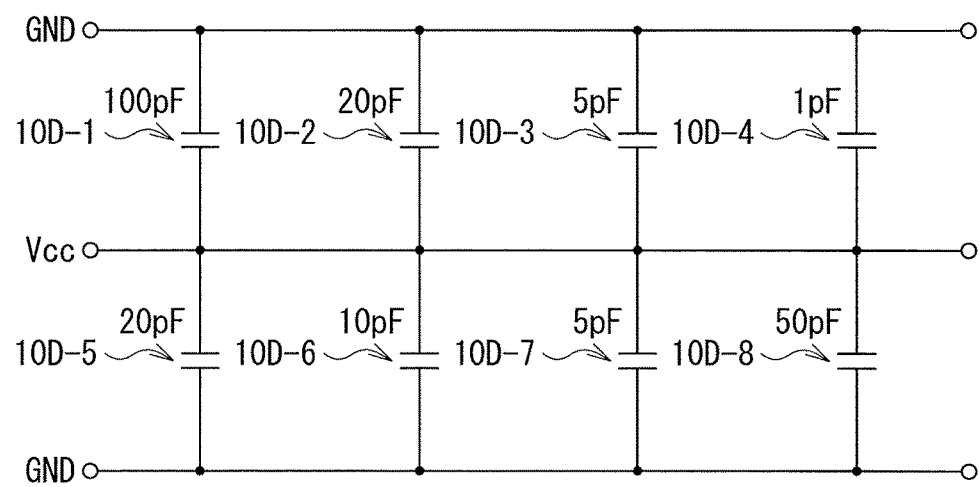
FIG. 63 is a circuit diagram illustrating a circuit of a comparative example in contrast to the circuit of FIG. 62.

FIG. 63 illustrates a circuit of a comparative example in contrast to the circuit of FIG. 62.

The circuit of the comparative example of FIG. 63 may have a configuration in which the coupling conductor (i.e., the resistance 41R) is eliminated from the circuit of FIG. 62. Other configurations are similar to those of the circuit of FIG. 62.

Figure 64:
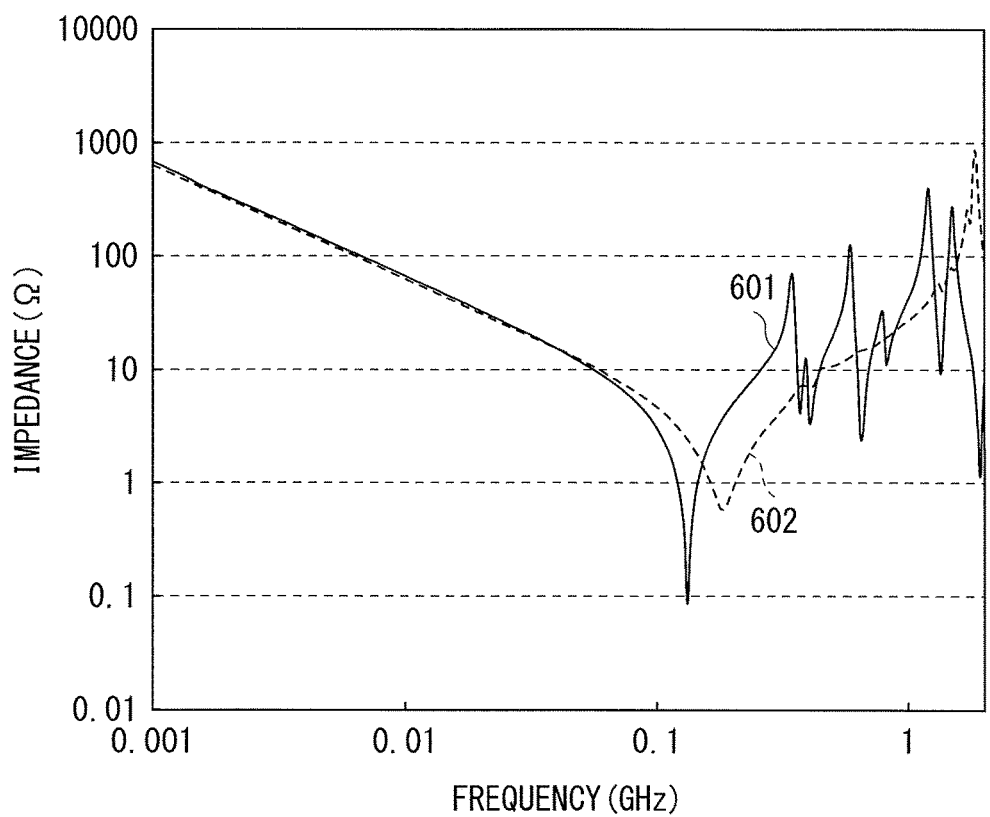
FIG. 64 is a characteristic diagram illustrating an example of respective impedance characteristics of the circuit of FIG. 62 and the circuit of FIG. 63.

FIG. 64 illustrates an example of respective impedance characteristics of the circuit of FIG. 62 and the circuit of the comparative example of FIG. 63. In FIG. 64, the impedance characteristics of the circuit of FIG. 62 are denoted with a reference numeral 602 (i.e., a broken line), and the impedance characteristics of the circuit of the comparative example of FIG. 63 are denoted with a reference numeral 601 (i.e., a solid line). The horizontal axis indicates a frequency, and the vertical axis indicates an impedance.

As illustrated in FIG. 64, impedance peaks due to the antiresonance occur in the circuit of the comparative example. In contrast, impedance peaks due to the antiresonance are suppressed in the circuit of FIG. 62.

6. Other Example Embodiments

The techniques according to the present disclosure are not limited to the foregoing respective example embodiments, and may be modified in a variety of ways.

For example, the substrate module mounted with any of the capacitors according to the foregoing respective example embodiments may be used as a substrate of a power supply module such as a DC-DC converter. In an alternative embodiment, the substrate module may be used as a substrate for a set of functions of a unit such as a smartphone, a personal computer (PC), and a notebook PC. In another alternative embodiment, the substrate module may be used as a substrate of a device such as a graphic board, a microcomputer board, a memory board, and a PCI Express board.

Moreover, the disclosure encompasses any possible combination of some or all of the various embodiments and the modification examples described herein and incorporated herein.

It is possible to achieve at least the following configurations from the above-described example embodiments of the disclosure.

(1) A substrate module including:
capacitors;
a first coupling conductor that couples two of the capacitors together; and
a mounting substrate that includes a first power supply layer and a second power supply layer,
the capacitors each including
a first electrode,
a second electrode,
a first terminal conductor coupled to the first electrode and to the first power supply layer,
a second terminal conductor coupled to the second electrode and to the second power supply layer, and
a third terminal conductor coupled to the first coupling conductor, the third terminal conductor being coupled to the first electrode at a coupling position that is different from a coupling position of the first terminal conductor.

(2) The substrate module according to (1), in which the third terminal conductor is coupled to the first electrode at a position closer to an open end of the first electrode than an intermediate position, the intermediate position being a position between the coupling position of the first terminal conductor in the first electrode and the open end.

(3) The substrate module according to (1) or (2), in which the third terminal conductors included in the respective two of the capacitors are intercoupled together via the first coupling conductor.

(4) The substrate module according to (3), further including a second coupling conductor that couples the two of the capacitors together, in which
the capacitors each further include a fourth terminal conductor coupled to the first electrode at a coupling position that is different from the coupling position of each of the first terminal conductor and the third terminal conductor, and
the fourth terminal conductors included in the respective two of the capacitors are intercoupled together via the second coupling conductor.

(5) The substrate module according to (3), further including a second coupling conductor that couples the two of the capacitors together, in which
the capacitors each further include a fourth terminal conductor coupled to the second electrode at a coupling position that is different from a coupling position of the second terminal conductor, and
the fourth terminal conductors included in the respective two of the capacitors are intercoupled together via the second coupling conductor.

(6) The substrate module according to (1) or (2), in which
the capacitors each further include a fourth terminal conductor coupled to the first electrode at a coupling position that is different from the coupling position of each of the first terminal conductor and the third terminal conductor, and
the third terminal conductor of a first capacitor of the two of the capacitors and the fourth terminal conductor of a second capacitor of the two of the capacitors are intercoupled together via the first coupling conductor.

(7) The substrate module according to (1), (2), or (6), further including a second coupling conductor that couples the two of the capacitors together, in which
the capacitors each further include a fifth terminal conductor coupled to the second coupling conductor, the fifth terminal conductor being coupled to the second electrode at a coupling position that is different from a coupling position of the second terminal conductor.

(8) The substrate module according to (7), in which
the capacitors each further include a sixth terminal conductor coupled to the second electrode at a coupling position that is different from the coupling position of each of the second terminal conductor and the fifth terminal conductor, and
the fifth terminal conductor of a first capacitor of the two of the capacitors and the sixth terminal conductor of a second capacitor of the two of the capacitors are intercoupled together via the second coupling conductor.

(9) The substrate module according to (1), in which the third terminal conductor is coupled to the first electrode at a position closer to a first end part of the first electrode in a longitudinal direction than an intermediate position, the intermediate position being a position between the coupling position of the first terminal conductor in the first electrode and the first end part.

(10) A capacitor including:
a first electrode;
a second electrode;
a first terminal conductor coupled to the first electrode, the first terminal conductor being further coupled to a first power supply layer upon mounting on a mounting substrate, the mounting substrate including the first power supply and a second power supply layer;
a second terminal conductor coupled to the second electrode, the second terminal conductor being further coupled to the second power supply layer upon mounting on the mounting substrate; and
a third terminal conductor coupled to the first electrode at a coupling position that is different from a coupling position of the first terminal conductor, the third terminal conductor being further coupled to one of terminal conductors included in any other capacitor via a first coupling conductor, upon mounting on the mounting substrate together with the any other capacitor that includes the terminal conductors.

It is possible to achieve the following configurations from the above-described example embodiments of the disclosure.

(A) A capacitor including:
a package;
a first electrode and a second electrode that face each other and are spaced apart from each other to avoid mutual contact, the first electrode and the second electrode being each wound in an eddy shape inside the package;
a first terminal conductor having a first end that is coupled to the first electrode and a second end that is led out of the package;
a second terminal conductor having a first end that is coupled to the second electrode and a second end that is led out of the package; and
a third terminal conductor having a first end and a second end, the first end being coupled to the first electrode at a coupling position that is different from a coupling position of the first terminal conductor, the second end being led out of the package.

(B) The capacitor according to (A), in which the first end of the third terminal conductor is coupled to the first electrode at a location between the coupling position of the first terminal conductor in the first electrode and a first end part of the first electrode in a longitudinal direction.

(C) The capacitor according to (B), in which the first end of the third terminal conductor is coupled to the first electrode at a position closer to the first end part of the first electrode in the longitudinal direction than an intermediate position, the intermediate position being a position between the coupling position of the first terminal conductor in the first electrode and the first end part.

(D) The capacitor according to (B) or (C), further including a fourth terminal conductor having a first end and a second end, the first end being coupled to the first electrode at a coupling position that is different from the coupling position of each of the first terminal conductor and the third terminal conductor, the second end being led out of the package.

(E) The capacitor according to (D), in which the first end of the fourth terminal conductor is coupled to the first electrode at a location between the coupling position of the first terminal conductor in the first electrode and a second end part of the first electrode in the longitudinal direction.

(F) The capacitor according to any one of (A) to (E), further including a fifth terminal conductor having a first end and a second end, the first end being coupled to the second electrode at a coupling position that is different from a coupling position of the second terminal conductor, the second end being led out of the package.

(G) The capacitor according to (F), in which the first end of the fifth terminal conductor is coupled to the second electrode at a location between the coupling position of the second terminal conductor in the second electrode and a first end part of the second electrode in a longitudinal direction.

(H) The capacitor according to (G), further including a sixth terminal conductor having a first end and a second end, the first end being coupled to the second electrode at a coupling position that is different from the coupling position of each of the second terminal conductor and the fifth terminal conductor, the second end being led out of the package.

(I) The capacitor according to (H), in which the first end of the sixth terminal conductor is coupled to the second electrode at a location between the coupling position of the second terminal conductor in the second electrode and a second end part of the second electrode in the longitudinal direction.

(J) A substrate module including:
  capacitors;
  a first coupling conductor that couples two of the capacitors together; and
  a mounting substrate that includes a first power supply layer and a second power supply layer,
  the capacitors each including
    a package,
    a first electrode and a second electrode that face each other and are spaced apart from each other to avoid mutual contact, the first electrode and the second electrode being each wound in an eddy shape inside the package,
    a first terminal conductor having a first end that is coupled to the first electrode and a second end that is coupled to the first power supply layer,
    a second terminal conductor having a first end that is coupled to the second electrode and a second end that is coupled to the second power supply layer, and
    a third terminal conductor having a first end and a second end, the first end being coupled to the first electrode at a coupling position that is different from a coupling position of the first terminal conductor, the second end being coupled to the first coupling conductor.

(K) The substrate module according to (J), in which the second ends of the corresponding third terminal conductors included in the respective two of the capacitors are intercoupled together via the first coupling conductor.

(L) The substrate module according to (J), in which
  the capacitors each further include a fourth terminal conductor having a first end that is coupled to the first electrode at a coupling position that is different from the coupling position of each of the first terminal conductor and the third terminal conductor, and
  the second end of the third terminal conductor of a first capacitor of the two of the capacitors and a second end of the fourth terminal conductor of a second capacitor of the two of the capacitors are intercoupled together via the first coupling conductor.

(M) The substrate module according to (L), in which
  the capacitors each further include
    a fifth terminal conductor having a first end that is coupled to the second electrode at a coupling position that is different from a coupling position of the second terminal conductor, and
    a sixth terminal conductor having a first end that is coupled to the second electrode at a coupling position that is different from the coupling position of each of the second terminal conductor and the fifth terminal conductor, and
  a second end of the fifth terminal conductor of the first capacitor of the two of the capacitors and a second end of the sixth terminal conductor of the second capacitor of the two of the capacitors are intercoupled together via a second coupling conductor.

According to the capacitor and the substrate module of the respective embodiments of the disclosure, it is possible to reduce the antiresonance without increasing the equivalent series resistance.

Although the disclosure has been described in terms of exemplary embodiments, it is not limited thereto. It should be appreciated that variations may be made in the described embodiments by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" as used herein can allow for a degree of variability in a value or range. Moreover, no element or component in this disclosure is intended to be dedicated to the public regardless of whether the element or component is explicitly recited in the following claims.

What is claimed is:

1. A substrate module comprising:
  capacitors;
  a first coupling conductor that couples two of the capacitors together;

a second coupling conductor that couples the two of the capacitors together;
a mounting substrate that includes a first power supply layer and a second power supply layer,
the capacitors each including
a first electrode,
a second electrode,
a first terminal conductor coupled to the first electrode and to the first power supply layer,
a second terminal conductor coupled to the second electrode and to the second power supply layer,
a third terminal conductor coupled to the first coupling conductor, the third terminal conductor being coupled to the first electrode at a coupling position that is different from a coupling position of the first terminal conductor, and
a fourth terminal conductor coupled to the first electrode at a coupling position that is different from the coupling position of each of the first terminal conductor and the third terminal conductor,
the third terminal conductors included in the respective two of the capacitors being intercoupled together via the first coupling conductor, and
the fourth terminal conductors included in the respective two of the capacitors being intercoupled together via the second coupling conductor.

2. The substrate module according to claim 1, wherein the third terminal conductor is coupled to the first electrode at a position closer to an open end of the first electrode than an intermediate position, the intermediate position being a position between the coupling position of the first terminal conductor in the first electrode and the open end.

3. The substrate module according to claim 1, wherein the third terminal conductor is coupled to the first electrode at a position closer to a first end part of the first electrode in a longitudinal direction than an intermediate position, the intermediate position being a position between the coupling position of the first terminal conductor in the first electrode and the first end part.

4. A substrate module comprising:
capacitors;
a first coupling conductor that couples two of the capacitors together; and
a mounting substrate that includes a first power supply layer and a second power supply layer,
the capacitors each including
a first electrode,
a second electrode,
a first terminal conductor coupled to the first electrode and to the first power supply layer,
a second terminal conductor coupled to the second electrode and to the second power supply layer,
a third terminal conductor coupled to the first coupling conductor, the third terminal conductor being coupled to the first electrode at a coupling position that is different from a coupling position of the first terminal conductor, and
a fourth terminal conductor coupled to the first electrode at a coupling position that is different from the coupling position of each of the first terminal conductor and the third terminal conductor,
the third terminal conductor of a first capacitor of the two of the capacitors and the fourth terminal conductor of a second capacitor of the two of the capacitors being intercoupled together via the first coupling conductor.

5. The substrate module according to claim 4, wherein the third terminal conductor is coupled to the first electrode at a position closer to an open end of the first electrode than an intermediate position, the intermediate position being a position between the coupling position of the first terminal conductor in the first electrode and the open end.

6. The substrate module according to claim 4, wherein the third terminal conductor is coupled to the first electrode at a position closer to a first end part of the first electrode in a longitudinal direction than an intermediate position, the intermediate position being a position between the coupling position of the first terminal conductor in the first electrode and the first end part.

7. A substrate module comprising:
capacitors;
a first coupling conductor that couples two of the capacitors together;
a second coupling conductor that couples the two of the capacitors together; and
a mounting substrate that includes a first power supply layer and a second power supply layer;
the capacitors each including
a first electrode,
a second electrode,
a first terminal conductor coupled to the first electrode and to the first power supply layer,
a second terminal conductor coupled to the second electrode and to the second power supply layer,
a third terminal conductor coupled to the first coupling conductor, the third terminal conductor being coupled to the first electrode at a coupling position that is different from a coupling position of the first terminal conductor, and
a fifth terminal conductor coupled to the second coupling conductor, the fifth terminal conductor being coupled to the second electrode at a coupling position that is different from a coupling position of the second terminal conductor.

8. The substrate module according to claim 7, wherein
the capacitors each further include a sixth terminal conductor coupled to the second electrode at a coupling position that is different from the coupling position of each of the second terminal conductor and the fifth terminal conductor, and
the fifth terminal conductor of a first capacitor of the two of the capacitors and the sixth terminal conductor of a second capacitor of the two of the capacitors are intercoupled together via the second coupling conductor.

9. The substrate module according to claim 7, wherein the third terminal conductor is coupled to the first electrode at a position closer to an open end of the first electrode than an intermediate position, the intermediate position being a position between the coupling position of the first terminal conductor in the first electrode and the open end.

10. The substrate module according to claim 7, wherein the third terminal conductor is coupled to the first electrode at a position closer to a first end part of the first electrode in a longitudinal direction than an intermediate position, the intermediate position being a position between the coupling position of the first terminal conductor in the first electrode and the first end part.

* * * * *